United States Patent
Teshirogi et al.

(10) Patent No.: US 7,432,114 B2
(45) Date of Patent: Oct. 7, 2008

(54) SEMICONDUCTOR DEVICE MANUFACTURING METHOD

(75) Inventors: Kazuo Teshirogi, Kawasaki (JP); Yuzo Shimobeppu, Kawasaki (JP); Kazuhiro Yoshimoto, Kawasaki (JP); Yoshiaki Shinjo, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 42 days.

(21) Appl. No.: 11/515,994

(22) Filed: Sep. 6, 2006

(65) Prior Publication Data

US 2007/0231961 A1 Oct. 4, 2007

(30) Foreign Application Priority Data

Mar. 30, 2006 (JP) ............................ 2006-095798

(51) Int. Cl.
*H01L 21/00* (2006.01)
(52) U.S. Cl. ........................... 438/3; 438/108; 438/455
(58) Field of Classification Search ................ 438/455, 438/3, 108
See application file for complete search history.

(56) References Cited

U.S. PATENT DOCUMENTS 5,986,348 A * 11/1999 Fukano ....................... 257/780
2006/0012020 A1 * 1/2006 Gilleo ........................ 257/678
2006/0013680 A1 * 1/2006 Haba et al. .................. 414/935
2006/0030071 A1 * 2/2006 Mizukoshi et al. .......... 438/106

FOREIGN PATENT DOCUMENTS

| JP | 62-1257 A | 1/1987 |
| JP | 10-112477 A | 4/1998 |
| JP | 11-266076 A | 9/1999 |
| JP | 2002-57433 A | 2/2002 |

* cited by examiner

*Primary Examiner*—Trung Dang
(74) *Attorney, Agent, or Firm*—Westerman, Hattori, Daniels & Adrian, LLP.

(57) ABSTRACT

To provide a low-cost, efficient semiconductor device manufacturing method for connecting electrodes of a pair of bases (e.g., a pair of a semiconductor chip and a circuit board, or a pair of semiconductor chips) together in a short time. The method of the present invention includes: forming magnetic bumps 34 on at least one of first and second bases 10A and 40 to be bonded together at their corresponding electrodes (e.g., electrodes 15 and electrodes 41); aligning the electrodes 15 of the first base 10A to positions corresponding to the electrodes 41 of the second base 40 for connection, by means of magnetic forces of the magnetic bumps 34 formed over the first base 10A; and connecting the electrodes 15 of the first base 10A to the electrodes 41 of the second base 40, wherein the alignment is made for a plurality of the first bases 10A at a time.

12 Claims, 28 Drawing Sheets

SEMICONDUCTOR DEVICE MANUFACTURING METHOD

CROSS-REFERENCE TO RELATED APPLICATIONS

This application is based upon and claims the benefits of the priority from the prior Japanese Patent Application No. 2006-095798 filed on Mar. 30, 2006, the entire contents of which are incorporated herein by reference.

BACKGROUND OF THE INVENTION

1. Field of the Invention

The present invention relates to a low-cost, efficient semiconductor device manufacturing method for connecting electrodes of a pair of bases (e.g., a pair of a semiconductor chip and a circuit board, or a pair of semiconductor chips) together in a short time.

2. Description of the Related Art

Electronic devices have become faster and smaller, and there is an increasing demand for high-density packaging of their electronic components.

Against this background, as a method for bonding a semiconductor component (semiconductor chip) on its substrate, so-called flip-chip bonding (face down bonding) has been employed in which one surface of the semiconductor chip is allowed to face the substrate, followed by bonding of electrodes on the chip to electrodes of the substrate In this flip-chip bonding strategy, bump electrodes for external connection are formed on the electrode pads of the semiconductor chip, and these bump electrodes are connected to the electrode interconnections of the substrate mechanically and electrically.

FIG. 7A illustrates an example of a so-called BGA (Ball Grid Array) semiconductor device having a semiconductor chip mounted on a substrate by flip-chip bonding. Moreover, FIGS. 7B to 7I illustrate an example of a manufacturing method for the semiconductor device.

As shown in FIG. 7A, the BGA semiconductor device includes a semiconductor chip 1A that is flip-chip mounted on the surface of a substrate 7 (also referred to as an interposer, or a circuit board) and is sealed with mold resin 8, with bumps 1B on the electrode pads of the semiconductor chip 1A being connected to electrodes 7B of the substrate 7 mechanically and electrically.

On the backside (the other surface) of the substrate 7, solder balls 9 are arranged as connection terminals.

A BGA semiconductor device of this sort is manufactured in the following manner: A semiconductor substrate 1 with a plurality of semiconductor components (semiconductor chips), each having bumps on its electrode pads and being formed over one surface of the semiconductor substrate 1 through a given wafer process as shown in FIG. 7B, is attached to a dicing tape 3 attached to a WF ring (wafer ring) 2 as shown in FIG. 7C.

The semiconductor substrate 1 is then cut into individual semiconductor chips 1A by, for example, blade dicing using a dicing blade B and, as shown in FIG. 7D, the dicing tape 3 is expanded to separate the semiconductor chips 1A from one another.

Using push-up pins (not shown) the semiconductor chips 1A are pushed up under the dicing tape 3 to be separated from the dicing tape 3, causing an holding tool T1 held above the semiconductor chips 1A to pick them up, and the holding tool T1 transfer them on a chip tray 4 for storage.

As shown in FIG. 7E, a holding tool T2 is then operated to pick up one of the semiconductor chips 1A from the chip tray 4. Before picking up, a camera 5 arranged above the semiconductor chip 1A recognizes the position of the semiconductor chip 1A on the chip tray 4 for position correction to ensure precise positioning of the holding tool T2.

Subsequently, the holding tool T2 carrying the semiconductor chip 1A is inverted, allowing the semiconductor chip 1A to be transferred to another holding tool T3 arranged above.

As shown in FIG. 7F, while recognizing by a lower camera 6A the positions of the electrode pads of the semiconductor chip 1A held by the holding tool T3, the positions of electrodes of the substrate 7 on which the semiconductor chip 1A is to be mounted are recognized by an upper camera 6B. The X, Y, and θ positions of the holding tool T3 are then corrected on the basis of the recognition results from the cameras 6A and 6B for precise alignment of the electrodes.

As shown in FIG. 7G, the semiconductor chips 1A are then sequentially bonded to the substrate 7 which has previously been coated with a pasty or film-shaped underfiller 7A.

As shown in FIG. 7H, the semiconductor chips 1A on the substrate 7 are sealed with the mold resin 8 at a time.

Solder balls 9 that serve as connection terminals are arranged over the backside of the substrate 7.

Thereafter, as shown in FIG. 7I, the substrate 7 sealed with mold resin 8 is cut into individual pieces by blade dicing using a second dicing blade B, thereby providing a separate semiconductor device as shown in FIG. 7A.

In a case where the semiconductor device is formed through such a manufacturing process, prior to flip-chip bonding, the positions of electrodes of the semiconductor chip and the positions of electrodes of the substrate are recognized, and position correction is made on the basis of the obtained positional information. In addition, each step is carried out on a chip-by-chip basis, requiring a great amount of time and increasing the manufacturing costs.

Methods have been proposed in which electrodes of semiconductor chips are magnetically aligned with those of the substrate before connecting them together (see Japanese Patent Application Laid-Open (JP-A) No. 62-001257, 2002-057433, 11-266076, and 10-112477).

For example, JP-A No. 62-001257 discloses a method in which alignment is made using magnetic material embedded in through holes, and JP-A No. 2002-057433 discloses a method in which magnets are arranged over the chips so that magnetic material on the substrate and the chips attract each other for bonding of the chips to the substrate.

In addition, JP-A No. 11-266076 discloses a method in which print circuit board's electrodes having bumps made of magnetic material are magnetically aligned with substrate's electrodes having a magnetic layer for bonding, and JP-A No. 10-112477 discloses a method in which pieces of magnetic material of IC chips are magnetically aligned with magnetic layers of the circuit board for connecting their electrodes together.

These methods can realize easy alignment of electrodes by means of magnetic force, however, each step in the method is carried out on a chip-by-chip basis, resulting poor productivity.

Thus, low-cost, efficient semiconductor device manufacturing methods have not been provided yet, where electrodes of a pair of bases (e.g., a pair of a semiconductor chip and a circuit board, or a pair of semiconductor chips) are connected together in a short time, and therefore, a technology has been sought after that can achieve reduction in the manufacturing costs by high-speed processing.

It is an object of the present invention to solve the foregoing conventional problems and to achieve the object described below.

More specifically, it is an object of the present invention to provide a low-cost, efficient semiconductor device manufacturing method for connecting electrodes of a pair of bases (e.g., a pair of a semiconductor chip and a circuit board, or a pair of semiconductor chips) together in a short time.

SUMMARY OF THE INVENTION

The following is the means for solving the foregoing problems:

The semiconductor device manufacturing method of the present invention includes: forming magnetic bumps over at least one of first and second bases which are to be bonded together at their corresponding electrodes; aligning the electrodes of the first base to positions corresponding to the electrodes of the second base for connection, by means of magnetic forces of the magnetic bumps formed over the first base; and connecting the electrodes of the first base to the electrodes of the second base, wherein the alignment is made for a plurality of the first bases at a time.

In the bump formation step magnetic bumps are formed over at least one of first and second bases to be bonded together at their corresponding electrodes. In the alignment step the electrodes of the first base are aligned to positions corresponding to the electrodes of the second base for connection, by means of magnetic forces of the magnetic bumps formed over the first base. At this point, the alignment is made for a plurality of the first bases at a time. In the electrode connection step the electrodes of the first base are connected to the electrodes of the second base.

In this way the electrodes of the pair of bases are readily connected together in a short time, achieving low-cost, efficient manufacturing of semiconductor devices.

DESCRIPTION OF THE PREFERRED EMBODIMENTS

Hereinafter, the semiconductor device manufacturing method of the present invention will be described with reference to Examples, which however shall not be construed as limiting the invention thereto.

EXAMPLE 1

First Example of the semiconductor device manufacturing method of the present invention will be described with reference to the drawings.

Figure 2A:
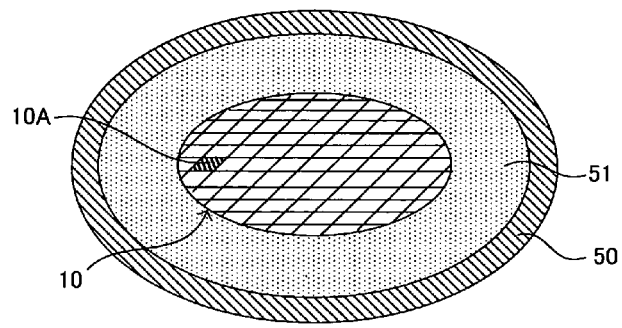
FIG. 2A is a perspective view showing the first step in First Example of the semiconductor device manufacturing method.

In this Example magnetic bumps are formed over each surface of multiple semiconductor chips 10A obtained from a semiconductor substrate 10 shown in FIG. 2A. Magnetic bumps that correspond to the magnetic bumps of the semiconductor chips 10A are also formed over a support substrate 40 shown in FIG. 2F.

Herein, the semiconductor chip 10A corresponds to the first base and the support substrate 40 corresponds to the second base. By connecting electrodes formed over these bases together, a semiconductor device is manufactured as a pair of bases.

An example of a magnetic bump formation method will be described with reference to FIGS. 1A to 1J.

It should be noted that each drawing characteristically illustrates one semiconductor chip chosen from multiple semiconductor chips obtained from a semiconductor substrate (semiconductor wafer) 10, and that in each drawing the drawing on the right is a plan view of the semiconductor chip and the one on the left is a cross-sectional view taken along A-A' line of the plan view.

Figure 1A:
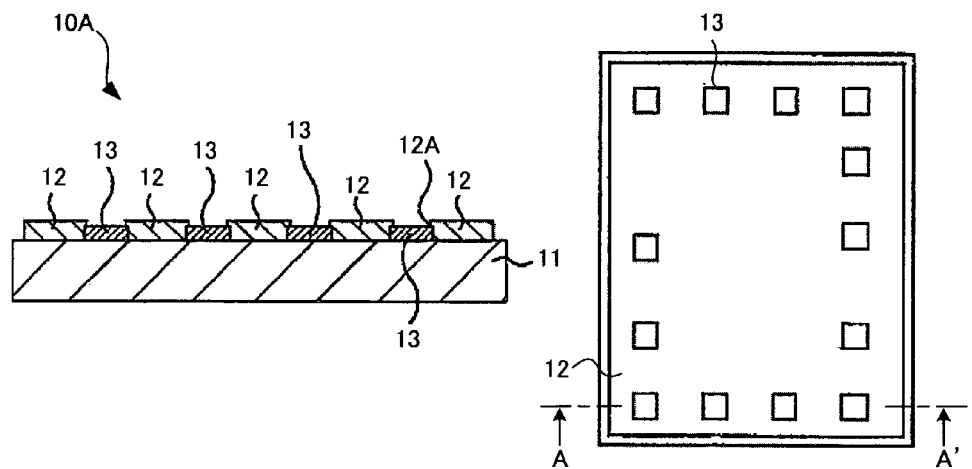
FIG. 1A is a step view showing the first bump formation step in a semiconductor device manufacturing method.

As shown in FIG. 1A, in the semiconductor device 10A, a silicon (Si) semiconductor substrate 11 includes on one surface an electric circuit (not shown) composed of functional elements (e.g., MOS transistors), passive elements (e.g., capacitive elements), interconnection layers, etc. Furthermore, the silicon (Si) semiconductor substrate 11 includes an insulating layer 12 made of, for example, silicon oxide arranged to cover the surface of the semiconductor substrate 11, openings 12A selectively formed in the insulating layer 12, and a plurality of metal layers 13 exposed in the openings 12A.

Examples of materials for the metal layers 13 include aluminum (Al), copper (Cu), gold (Au), silver (Ag), nickel (Ni), tungsten (W) and alloys thereof. These are used interchangeably depending on the intended purpose.

Figure 1B:
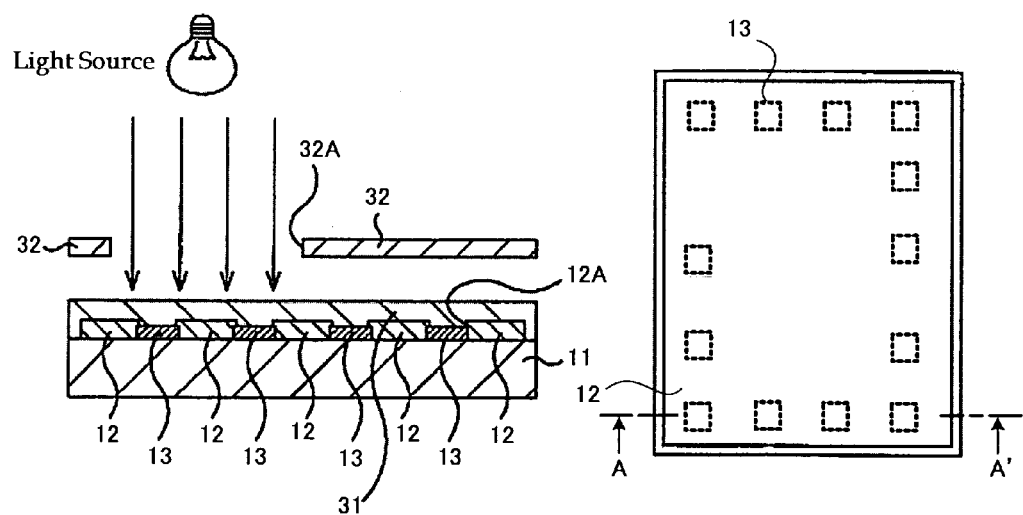
FIG. 1B is a step view showing the second bump formation step in the semiconductor device manufacturing method.

As shown in FIG. 1B, a photosensitive resin layer 31 made of polyimide or the like is formed over the semiconductor substrate 11 so as to cover the insulating layer 12 and the metal layers 13. Subsequently, the photosensitive resin layer 31 is selectively exposed using a photomask 32 that has openings 32A at positions corresponding to predetermined metal layers 13.

Figure 1C:
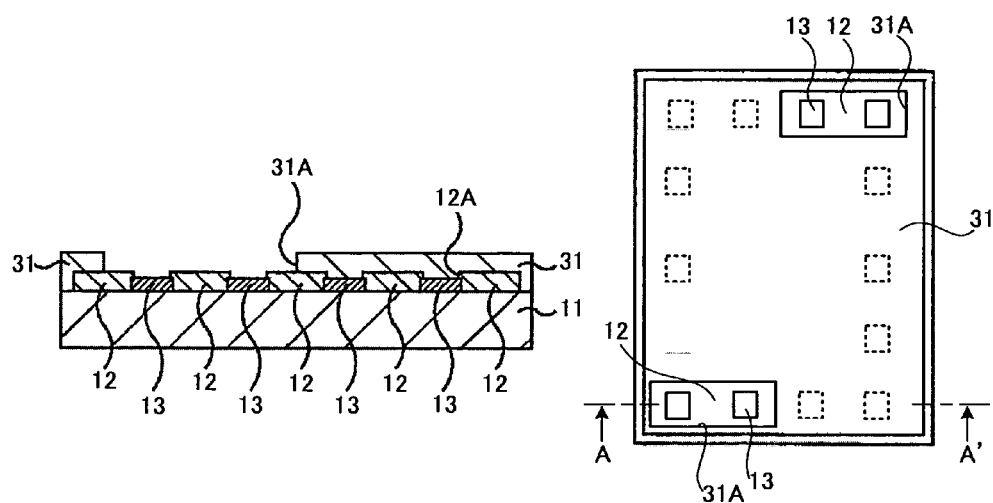
FIG. 1C is a step view showing the third bump formation step in the semiconductor device manufacturing method.

After developing the photosensitive resin layer 31, as shown in FIG. 1C, openings 31A are formed in the photosensitive layer 31, through which predetermined metal layers 13 are exposed. In this example two openings 31A are formed in the semiconductor chip 10A, and two adjacent metal layers 13 are exposed through each opening 31A.

Figure 1D:
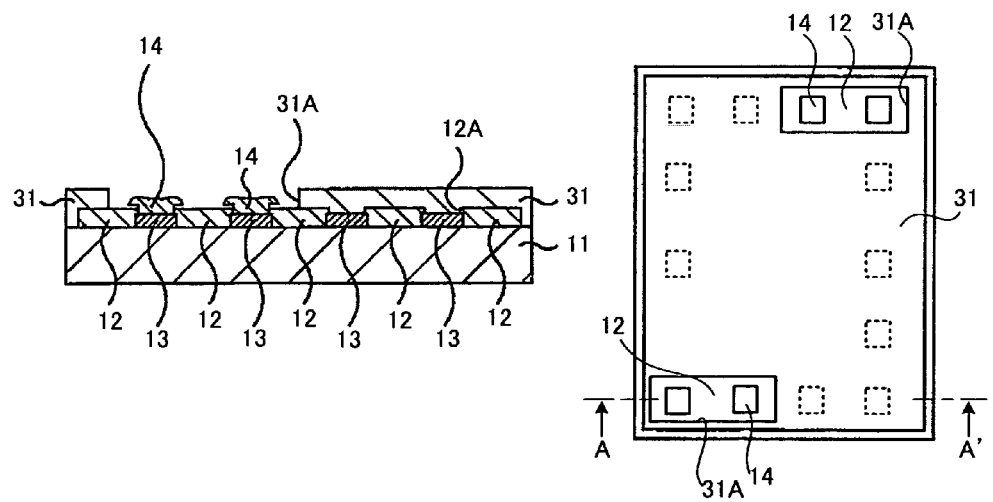
FIG. 1D is a step view showing the fourth bump formation step in the semiconductor device manufacturing method.

After curing the photosensitive resin layer 31, as shown in FIG. 1D, nickel (Ni) and gold (Au) are sequentially deposited on the metal layers 13 in the openings 31A by, for example, electroless plating to form metal pads 14.

Figure 1E:
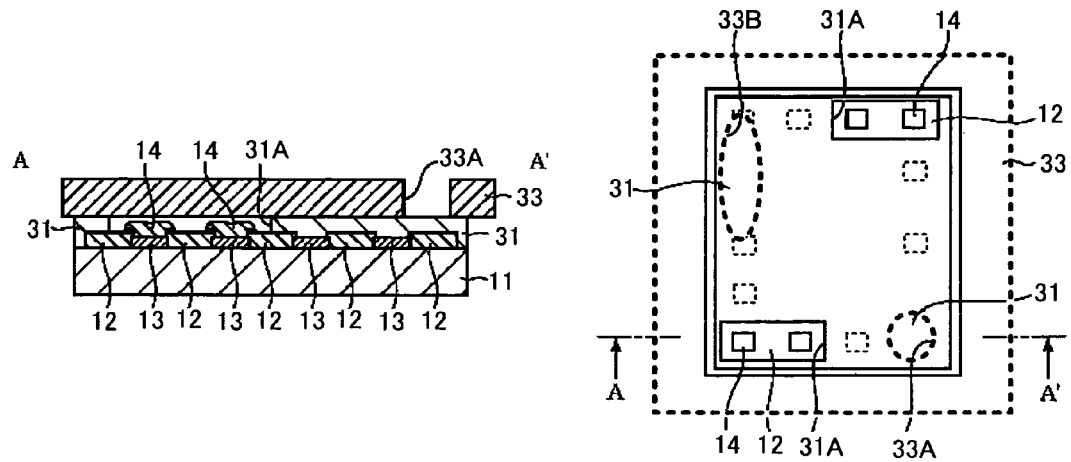
FIG. 1E is a step view showing the fifth bump formation step in the semiconductor device manufacturing method.

Next, as shown in FIG. 1E, a first metal mask 33 is placed on the photosensitive resin layer 31.

Openings 33A and 33B are formed in the first metal mask 33 at positions corresponding to the positions other than the openings 31 in the photosensitive resin layer 31. The openings 33A and 33B are present at substantially the diagonal corners of the semiconductor chip 10A and differ in shape.

Note in FIG. 1E that the frame of the first metal mask 33 and the openings 33A and 33B are denoted by dotted lines in their plan views on the right side.

Figure 1F:
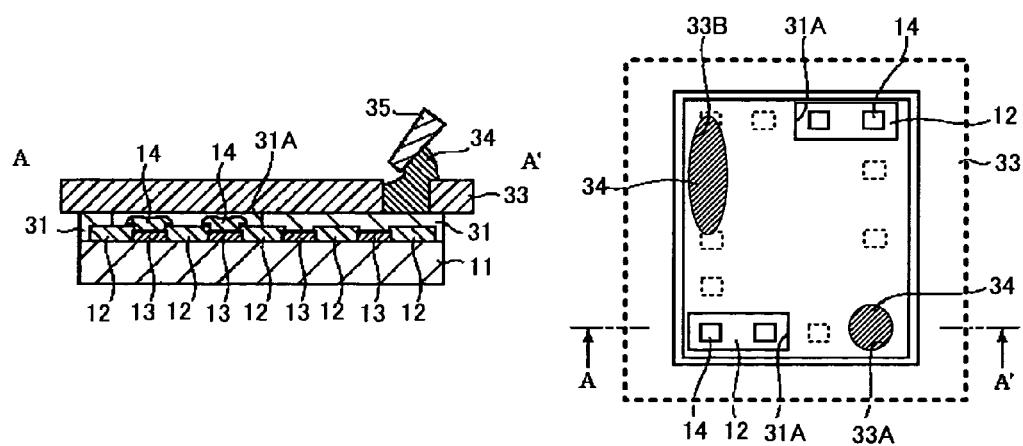
FIG. 1F is a step view showing the sixth bump formation step in the semiconductor device manufacturing method.

As shown in FIG. 1F, with a printing method using a squeegee 35 and the first metal mask 33, the openings 33A and 33B in the first metal mask 33 are filled with a magnetic paste 34, covering the photosensitive resin layer 31 exposed in the openings 33A and 33B.

The magnetic paste 34 is pasty magnetic fine particles kneaded with adhesive resin. Any magnetic fine particles can be used depending on the intended purpose; however, the Curie point (Tc) at which magnetization disappears is preferably at or below the curing temperature at which resin is half-cured, e.g., it is preferably 100° C. or less.

For such fine particles, for example, nickel (Ni)-zinc (Zn) soft ferrite ("XS1", produced by FDK Corp.) may be used.

Figure 1G:
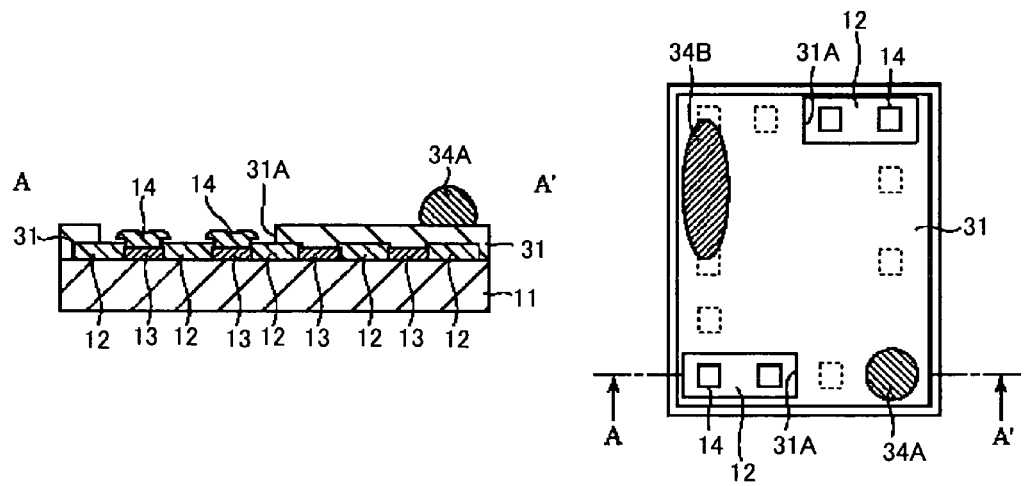
FIG. 1G is a step view showing the seventh bump formation step in the semiconductor device manufacturing method.

Next, as shown in FIG. 1G, the first metal mask 33 is removed, and the magnetic paste 34 is half-cured at temperatures ranging from 80° C. to 110° C. (so-called B-stage curing), forming magnetic patterns 34A and 34B on the photosensitive resin layer 31.

The magnetic pattern 34A is formed of the magnetic paste 34 loaded in the two openings 33A, and the magnetic pattern 34B is formed of the magnetic paste 34 loaded in the opening 33B. The magnetic patterns 34A and 34B lose their magnetization by treatment with heat for half-curing.

Figure 1H:
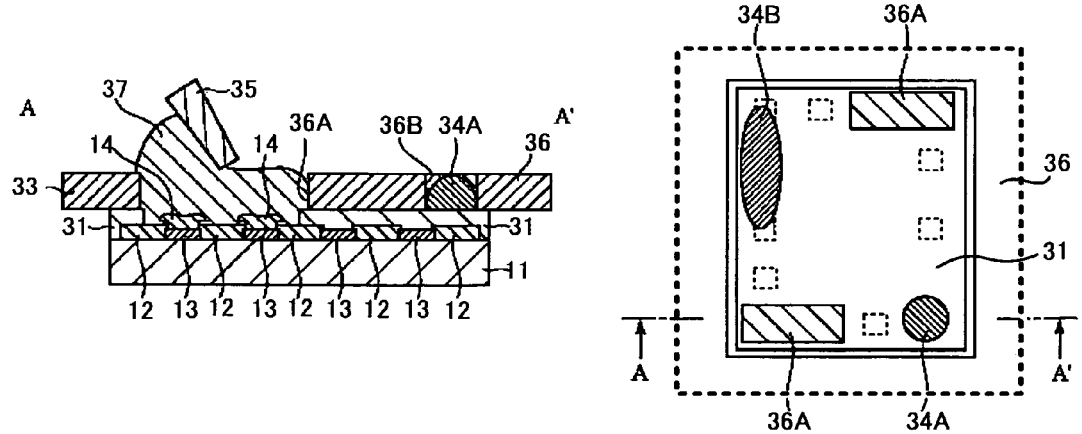
FIG. 1H is a step view showing the eighth bump formation step in the semiconductor device manufacturing method.

Next, as shown in FIG. 1H, a second metal mask 36 is placed on the photosensitive resin layer 31.

In the second metal mask 36, openings 36A that are larger in size than the openings 31A are formed at positions corresponding to the two openings 31A in the photosensitive resin layer 31, and openings 36B and 36C that are larger in size than the magnetic patterns 34A and 34B are formed in regions where the magnetic patterns 34A and 34B are formed.

At this point, the second metal mask 36 is so aligned that the metal layers 14 are positioned in the openings 36A and the magnetic patterns 34A and 34B are positioned in the openings 36B and 36C.

Note also in FIG. 1H that the frame of the second metal mask 36 and the openings 36A are denoted by dotted lines in their plan views on the right side.

Subsequently, with a printing method using the squeegee 35 and the second metal mask 36, the openings 36A to 36C in the second metal mask 36 are filled with a silver (Ag) paste 37.

The Ag paste 37 is then half-cured at temperatures ranging from 80° C. to 110° C. (so-called B-stage curing), forming electrodes 15 electrically connected to metal pads 14 in the openings 31A of the photosensitive resin layer 31.

If the half-curing temperature of the magnetic paste 34 is close to that of the silver (Ag) paste 37, they may be subjected to half-curing treatment together.

Figure 1I:
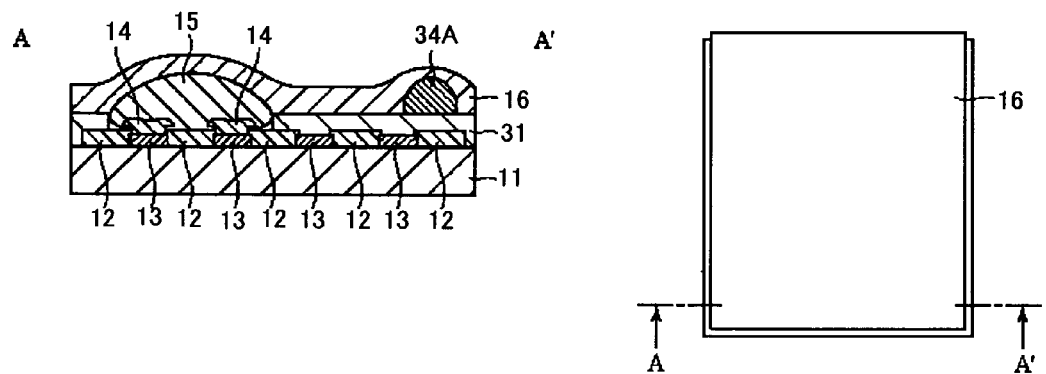
FIG. 1I is a step view showing the ninth bump formation step in the semiconductor device manufacturing method.

Next, as shown in FIG. 1I, an insulating film 16 made of adhesive insulating material is formed that covers the electrodes 15, magnetic patterns 34A and 34B, etc.

The adhesive insulating material should be one that is solid at normal temperature, softened at a temperature, for example, about 110° C. or above, hardened above this softening temperature (e.g., 130° C. or above) and remains hardened even exposed to normal temperature once hardened.

For such insulating material, film-shaped epoxy resin adhesives and B-stage adhesives can be used according to the intended purpose.

The use of adhesive insulating material can eliminate in the downstream processing a step of applying underfiller between the support substrate and the semiconductor chip, realizing simplification of the manufacturing process.

Figure 1J:
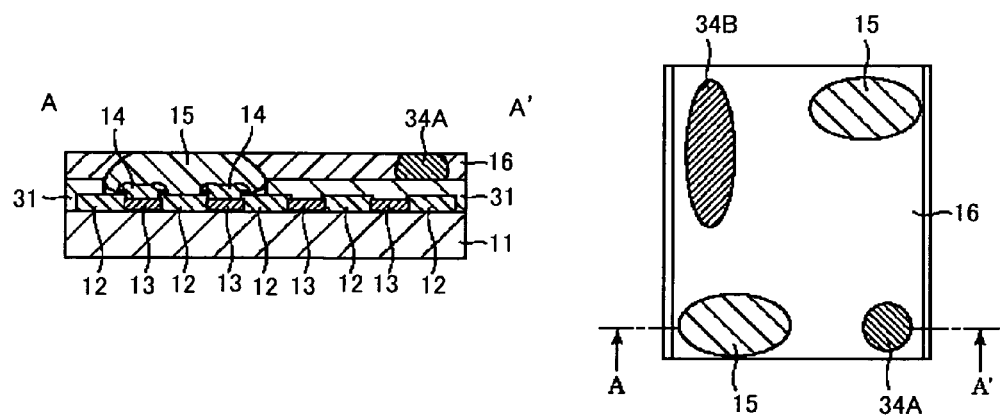
FIG. 1J is a step view showing the tenth bump formation step in the semiconductor device manufacturing method.

Using a hard cutting tool made of diamond or the like (not shown), a series of cutting process is performed for the electrodes 15, magnetic patterns 34A and 34B and insulating film 16 that are formed over the semiconductor chip 10A to flatten their surfaces as shown in FIG. 1J.

As a consequence, the electrodes 15, magnetic patterns 34A and 34B and insulating film 16 become substantially equal in height, forming a continuous flat surface. This relaxes load or heating temperature conditions in a downstream bonding operation.

Throughout the entire cutting step, the electrodes 15 and insulating layer 16 are cut without being softened, i.e., cut in solid state.

More specifically, the temperature of the semiconductor substrate 11 to be worked on is set to a temperature below around 80° C. (e.g., 50° C.), which is the softening (half-softening) temperature of any one of the electrodes 15, magnetic patterns 34A and 34B or insulating film 16—whichever is lower. The temperatures of both the electrodes 15 and insulating 16, which increase during the cutting process, are controlled to below 80° C., allowing planarization to be carried out at temperatures below 80° C. throughout the entire cutting step.

By such planarization, the cut surfaces of the electrodes 15 and the magnetic patterns 34A and 35B (hereinafter collectively referred to as "magnetic bumps" in some cases), surrounded by the insulating film 16, are exposed at the surface of the semiconductor chip 10A.

At this time, the electrodes 15, magnetic patterns 34A and 34B, and insulating film 16 can be distinguished according to their surface reflectivity and color phase using a reflectivity measurement device and/or a camera device. For this reason, opaque materials can be used for the insulating film 16.

If the insulating film 16 is opaque, it is impossible to see its inside from the surface of the planarized semiconductor chip 10A, preventing someone from maliciously changing the stored information, e.g., alternation of ROM content.

A dicing process is then carried out for the semiconductor substrate 10 for separation of a plurality of semiconductor chips, each having the electrodes 15, magnetic patterns 34A and 34B, and insulating film 16 which have been planarized.

A step of mounting semiconductor chips obtained from the dicing process on a support substrate will be described with reference to FIGS. 2A to 2O.

Figure 2B:
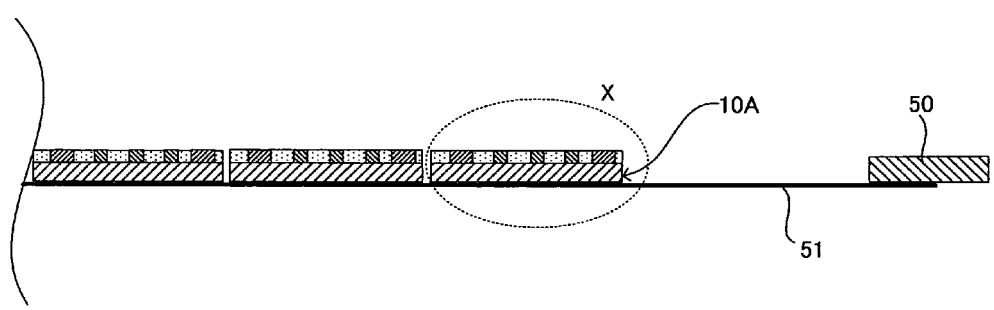
FIG. 2B is a vertical cross-sectional view showing the first step in First Example of the semiconductor device manufacturing method.
Figure 2C:
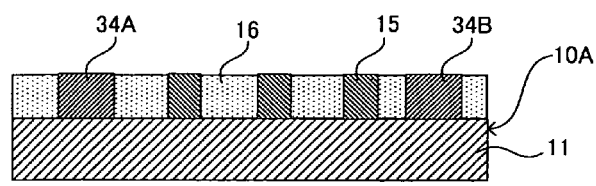
FIG. 2C is an enlarged vertical cross-sectional view showing a separate semiconductor chip in FIG. 2B.
Figure 2D:
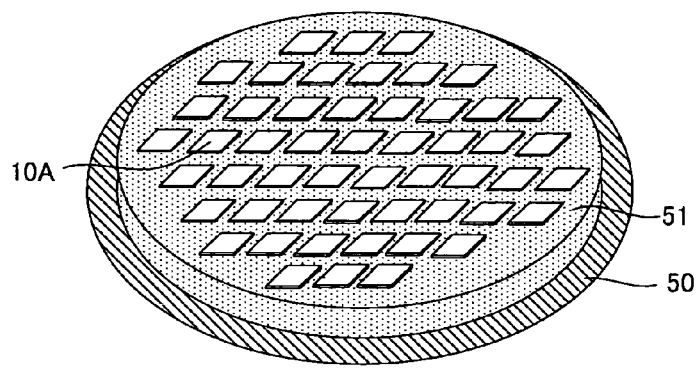
FIG. 2D is a perspective view showing the second step in First Example of the semiconductor device manufacturing method.
Figure 2E:
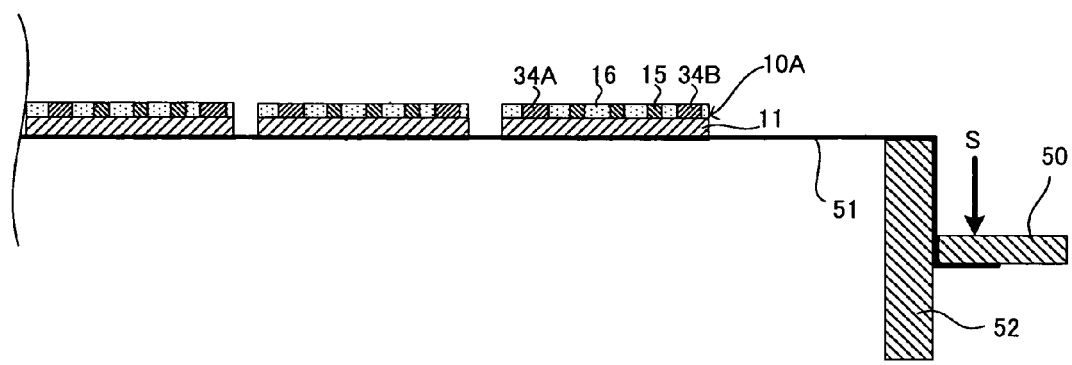
FIG. 2E is a vertical cross-sectional view showing the second step in First Example of the semiconductor device manufacturing method.
Figure 2F:
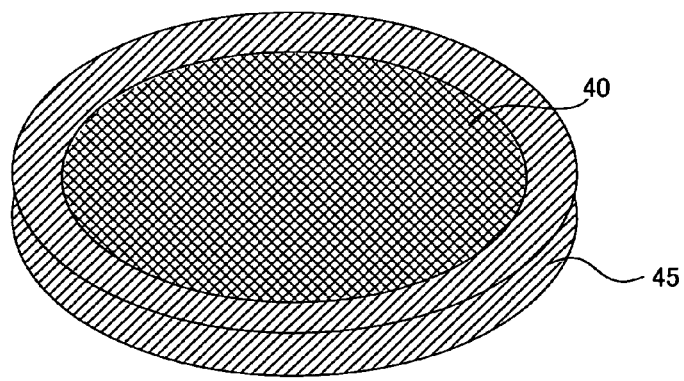
FIG. 2F is a perspective view showing the third step in First Example of the semiconductor device manufacturing method.
Figure 2G:
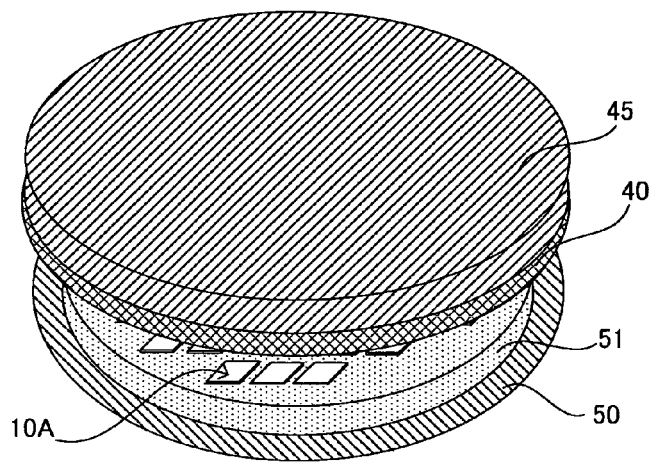
FIG. 2G is a perspective view showing the fourth step in First Example of the semiconductor device manufacturing method.
Figure 2H:
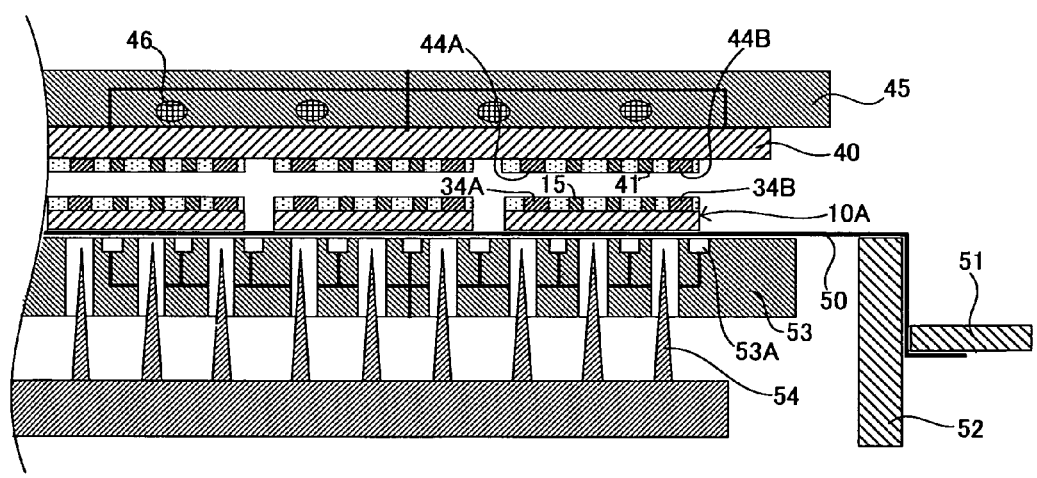
FIG. 2H is a vertical cross-sectional view showing the fourth step in First Example of the semiconductor device manufacturing method.
Figure 2I:
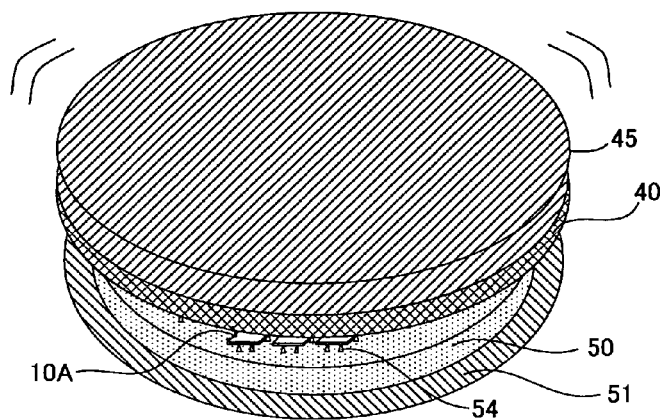
FIG. 2I is a perspective view showing the fifth step in First Example of the semiconductor device manufacturing method.
Figure 2J:
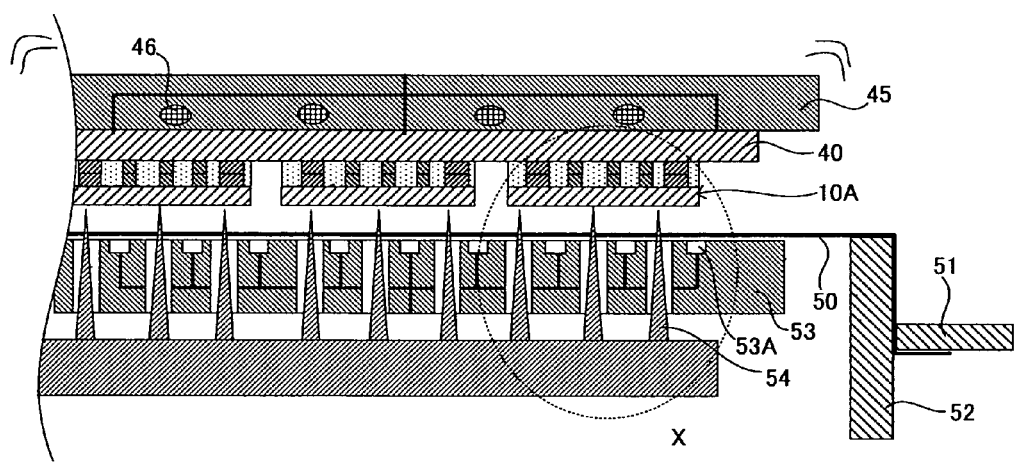
FIG. 2J is a vertical cross-sectional view showing the fifth step in First Example of the semiconductor device manufacturing method.
Figure 2K:
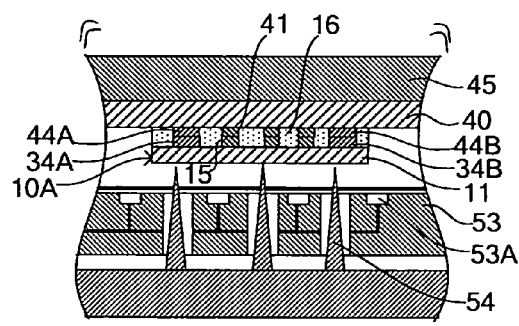
FIG. 2K is an enlarged vertical cross-sectional view showing a separate semiconductor chip in FIG. 2J.
Figure 2L:
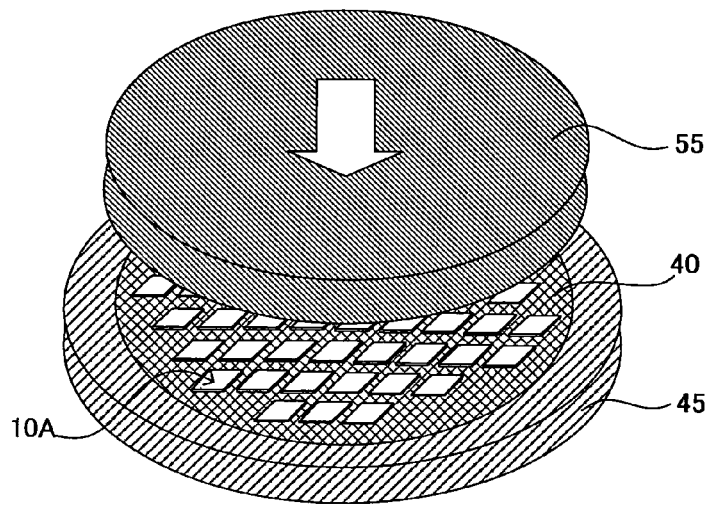
FIG. 2L is a perspective view showing the sixth step in First Example of the semiconductor device manufacturing method.
Figure 2M:
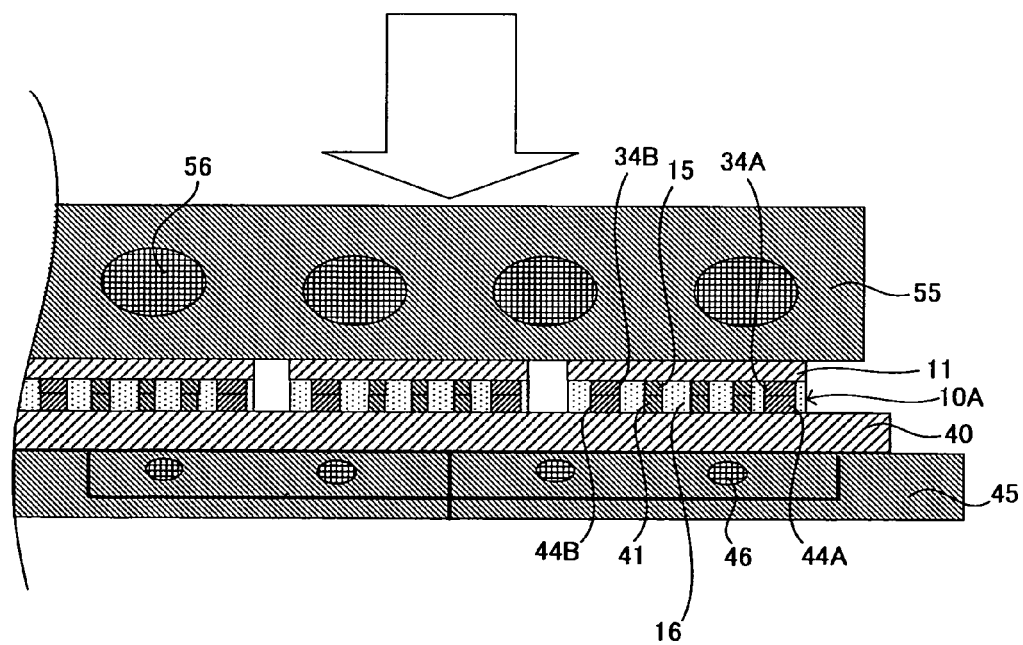
FIG. 2M is a vertical cross-sectional view showing the sixth step in First Example of the semiconductor device manufacturing method.
Figure 2N:
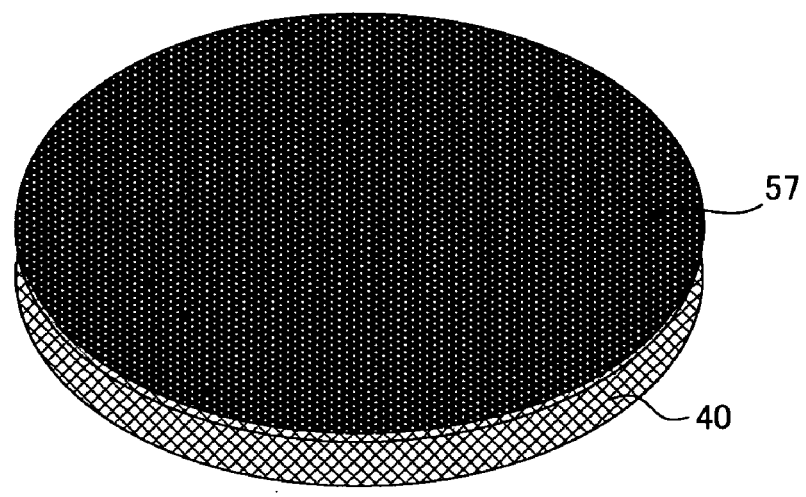
FIG. 2N is a perspective view showing the seventh step in First Example of the semiconductor device manufacturing method.
Figure 2O:
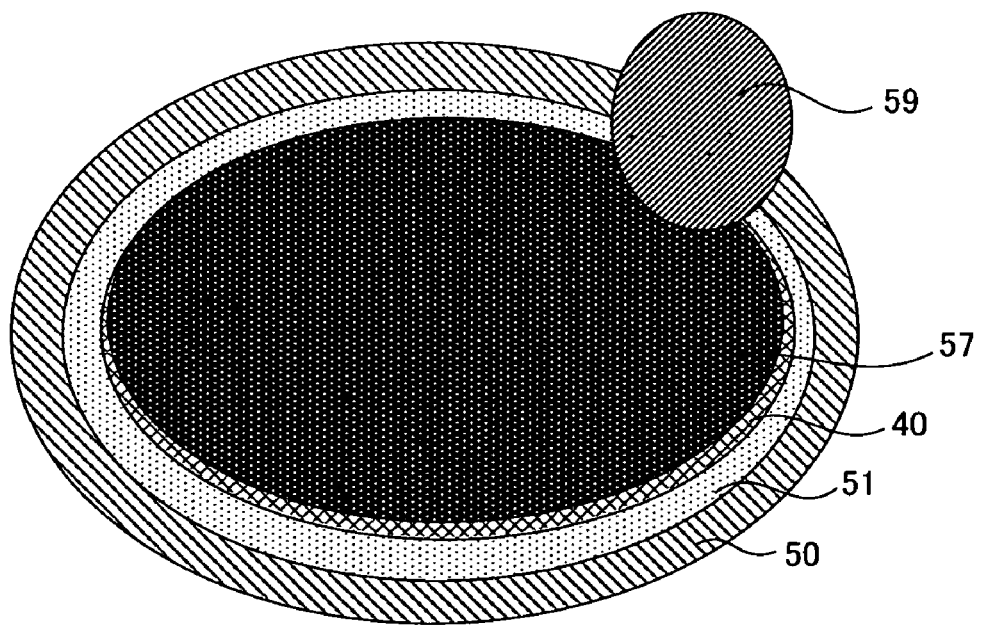
FIG. 2O is a perspective view showing the eighth step in First Example of the semiconductor device manufacturing method.

In the steps shown in FIGS. 2A to 2O, the positions where the electrodes 15, magnetic bumps 34, etc., are formed are different from those in the steps shown in FIGS. 1A and 1J.

As shown in FIG. 2A, the semiconductor substrate 10 is attached to a dicing tape 51 supported by a WF ring (wafer ring) 50.

The semiconductor substrate 10 is then cut into individual semiconductor chips 10A through a dicing process using a dicing blade (not shown), as shown in FIG. 2B. The dicing process may be either a laser beam process or a chemical process such as etching, rather than the blade process.

Note that FIG. 2B shows a vertical cross-section of the semiconductor substrate 10 on the dicing tape 51, and a separate semiconductor chip 10A in the X portion encircled by a dotted line is shown in FIG. 2C.

The support substrate 40 (e.g., a circuit board) is so designed that it can accommodate the plurality of semiconductor chips 10A, and electrodes 41 to be connected to the electrodes 15 of the separate semiconductor chips 10A are previously arranged at every region where the semiconductor chips 10A are to be mounted.

In each semiconductor chip 10A mounting region, magnetic patterns 44A and 44B (hereinafter collectively referred to as "magnetic bumps 44" in some cases) are arranged at positions corresponding to the magnetic patterns 34A and 34B (magnetic bumps 34) of each semiconductor chip 10A.

More specifically, the magnetic patterns 44A and 44B on the support substrate 40 are selectively arranged in such a way that the electrodes 15 on the semiconductor chips 10A and the electrodes 41 on the support substrate 40 are connected together when the magnetic patterns 34A and 34B of the semiconductor chips 10A are bonded to the magnetic patterns 44A and 44B.

As magnetic materials used to form the magnetic patterns 44A and 44B, those having the Curie point (Tc) of, for example, 150° C. are preferable, the Curie point being below heat treatment temperature at which electrode 15 resin and insulating film 16 resin are cured in downstream steps. Examples of such magnetic materials include vanadium (V) hard ferrite ("XH1," produced by FDK Corp.).

The magnetic patterns 44A and 44B on the support substrate 40, prior to mounting of the semiconductor chips 10A, have magnetization.

This is the bump formation step in the semiconductor device manufacturing method of the present invention.

After singulation, the dicing tape 51 is expanded to widen the space between adjacent semiconductor chips 10A, as shown in FIGS. 2D and 2E. The dicing tape 51 can be expanded by pushing down the WF ring 50 along the circumferential surface of an expansion ring 52, as indicated by arrow S of FIG. 2E.

Note that it is preferable that the space between adjacent semiconductor chips 10A be widened to an extent that the semiconductor chips 10A are aligned with the positions of the support substrate 40, where they are to be mounted.

As shown in FIG. 2F, the support substrate 40 is then attached to a substrate holder 45, and as shown in FIG. 2G, the support substrate 40 is placed above the dicing tape 51 so that its surface—the semiconductor mounting surface—face the plurality of spaced semiconductor chips 10A. At this point, precise alignment is not required.

As shown in FIG. 2H, the substrate holder 45 incorporates heaters 46 capable of heating the support substrate 40 as needed.

Under the dicing tape 51 holding separate semiconductor chips 10A on its surface, a WF table (wafer table) 53 is arranged inside the expansion ring 52, as shown in FIG. 2H.

A number of push-up pins 54 are provided under the WF table 53, which are configured to upwardly protrude to the semiconductor chip 10A side through holes 53A provided in the WF table 53.

A plurality of vacuum aspiration holes 53B connected to an aspiration device (not shown) is provided on the surface of the WF table 53. The dicing tape 51 is held against the surface of the WF table 53 by vacuum aspiration through the vacuum aspiration holes 53B.

Subsequently, as shown in FIGS. 2I and 2J, the semiconductor chips 10A are separated from the dicing tape 51, and bonded to the support substrate 40.

As shown in FIG. 2J, the push-up pins 54 are pushed up, with the support substrate 40 being placed above the semiconductor chips 10A, thereby separating the semiconductor chips 10A from the dicing tape 51.

Here, the level of push-up is determined depending on the magnitude of magnetic forces between the magnetic bumps 34 and magnetic bumps 44 and/or on the size of the semiconductor chips 10A; it is sufficient that the semiconductor chips 10A can be separated from the dicing tape 51. Thus, there is no need to push up the push-up pins 54 to an extent of crashing through the dicing tape 51.

When the semiconductor chips 10A are pushed up, the magnetic bumps 34 on the semiconductor chips 10A and the magnetic bumps 44 on the support substrate 40 attract each other due to the magnetic forces acting between them.

As a result, the semiconductor chips 10A are automatically brought in proper alignment with of the support substrate 40.

The region where the push-up pins 54 are arranged covers the entire surface of the semiconductor substrate 10, and the semiconductor chips 10A on the semiconductor substrate 10 are separated at the same time. For this reason, all the semiconductor chips 10A are brought in alignment with the support substrate 40 at about the same time.

FIG. 2K shows how the semiconductor chip 10A in the X portion encircled by a dotted line of FIG. 2J is bonded to the support substrate 40. As shown in FIG. 2K, the electrodes 15 of the semiconductor chip 10A are connected to the electrodes 41 of the support substrate 40.

This is the alignment step in the semiconductor device manufacturing method of the present invention.

Note in this step that vibrating the support substrate 40 as shown in FIGS. 2I and 2K can facilitate alignment.

Subsequently, the heaters 46 in the substrate holder 45 are turned on to heat the support substrate 40 to a temperature where the insulating film 16 becomes sticky, thereby bonding the semiconductor chips 10A to the support substrate 40 on a temporary basis. In this case, it is only necessary to heat the support substrate 40 to a temperature where the insulating film 16 becomes sticky.

Thereafter, the support substrate 40 is flipped over, placing it with its surface where the semiconductor chips 10A have been bonded face up.

As shown in FIG. 2L, a pressurizing tool 55 is then held above the support substrate 40. Heaters 56 are embedded in the pressuring tool 55, which can be turned on for heating as needed.

After the pressuring tool 55 is moved down and allowed to contact the semiconductor chips 10A as shown in FIG. 2M, the pressuring tool 55 is pressed against the semiconductor chips 10A for a given period of time while heating.

As a result, the semiconductor chips 10A and the support substrate 40 are bonded together at their electrodes (i.e., the electrodes 15 and the electrodes 41) in a state where they are in proper alignment.

This is the electrode connection step in the semiconductor device manufacturing method of the present invention.

The support substrate 40 is then detached from the substrate holder 45 and as shown in FIG. 2N, the surface of the support substrate 40 having the semiconductor chips 10A is sealed with sealing resin 57.

Solder balls 58 that serve as connection terminals are formed on the backside of the support substrate 40. These operations are carried out at a wafer level.

As shown in FIG. 2O, the support substrate 40 is attached on a dicing tape 51 attached to a WF ring 50.

Figure 3A:
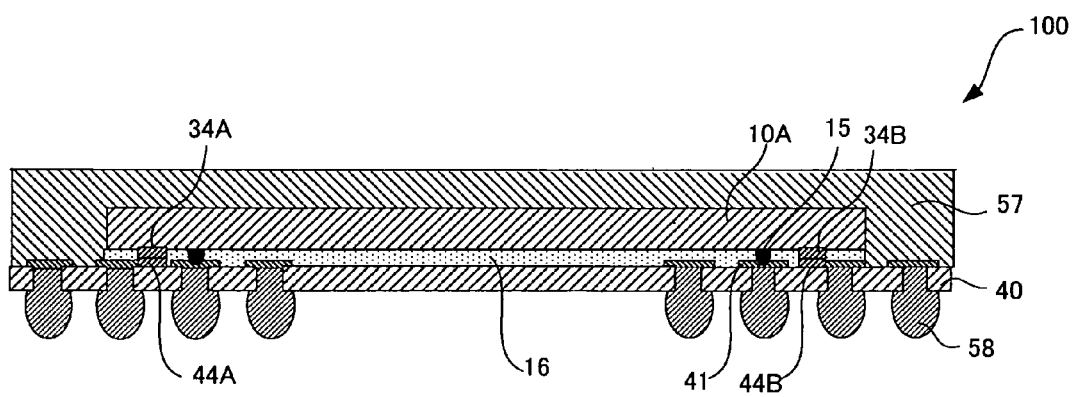
FIG. 3A is a schematic vertical cross-sectional view showing an example of a semiconductor device manufactured using he semiconductor device manufacturing method in First Example.

Using a dicing blade 59, the sealing resin between adjacent semiconductor chips 10A and the support substrate 40 are diced to produce a separate semiconductor device 100 shown in FIG. 3A. This semiconductor device 100 is referred to as a BGA semiconductor device.

As described above, in Example 1, when electrodes on the semiconductor chips are electrically connected to, and aligned with those of the support substrate, magnetic materials arranged both on the semiconductor chips and the support substrate are used for alignment. Thus, in this Example, the semiconductor chips can be brought in proper alignment with the support substrate on a semiconductor substrate-by-semiconductor substrate basis.

It is therefore made possible to significantly reduce the manufacturing time and to achieve reduction in the manufacturing costs.

With the semiconductor device manufacturing method of the present invention, such semiconductor devices of various types as shown below can be readily manufactured.

Figure 3B:
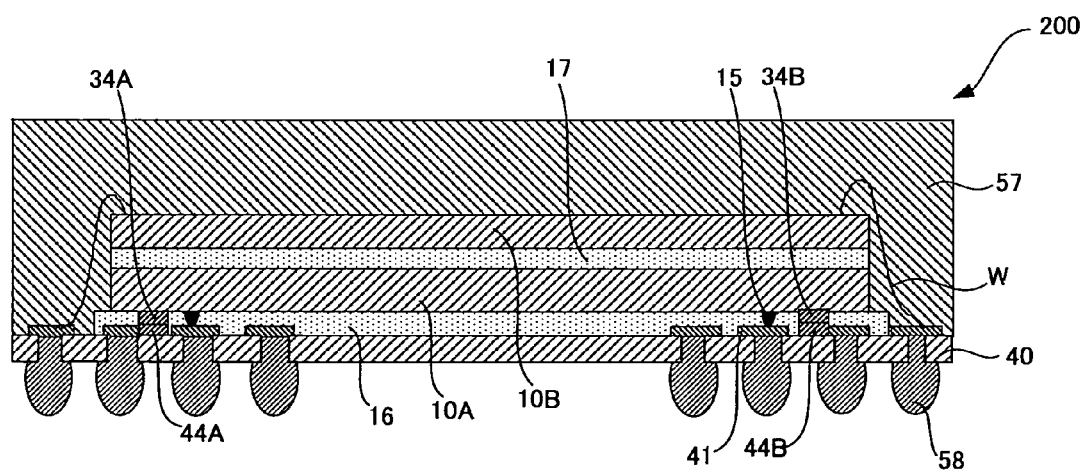
FIG. 3B is a schematic vertical cross-sectional view showing the first modification of a semiconductor device manufactured using the semiconductor device manufacturing method in First Example.

FIG. 3B shows an example of a semiconductor device having a dual-chip semiconductor structure manufactured using the semiconductor device manufacturing method of the present invention.

In the dual-chip semiconductor device 200 shown in this drawing, two semiconductor chips 10A and 10B are stacked on the upper surface of the support substrate 40.

The lower (first) semiconductor chip 10A is attracted to the support substrate 40 for alignment due to the magnetic forces between the magnetic bumps 34A and 34B on the surface of the semiconductor chip 10A and the magnetic bumps 44A and 44B on the support substrate 40. The semiconductor chip 10A is fixed to the support substrate 40 with underfiller 16, with the electrodes 15 on its surface being connected to the electrodes 41 of the support substrate 40, i.e., with the semiconductor chip 10A being flip-chip mounted (face down) on the support substrate 40.

Meanwhile, the upper (second) semiconductor chip 10B is mounted on the lower (first) semiconductor chip 10A and fixed to it by means of a die attach 17, with its surface having electric circuits, interconnection patterns, etc., being placed face up.

As connection terminals, solder balls 58 are arranged over the other surface (lower surface) of the support substrate 40, and fixed to the electrodes 41.

One end of each wire W is connected to an electrode of the semiconductor chip 10B, and the other end is connected to the connection terminal via the electrode 41 of the support substrate 40. Thus, the support substrate 40, semiconductor chip 10A, and semiconductor chip 10B are electrically connected together, and sealed with sealing resin 57 in this state.

Figure 3C:
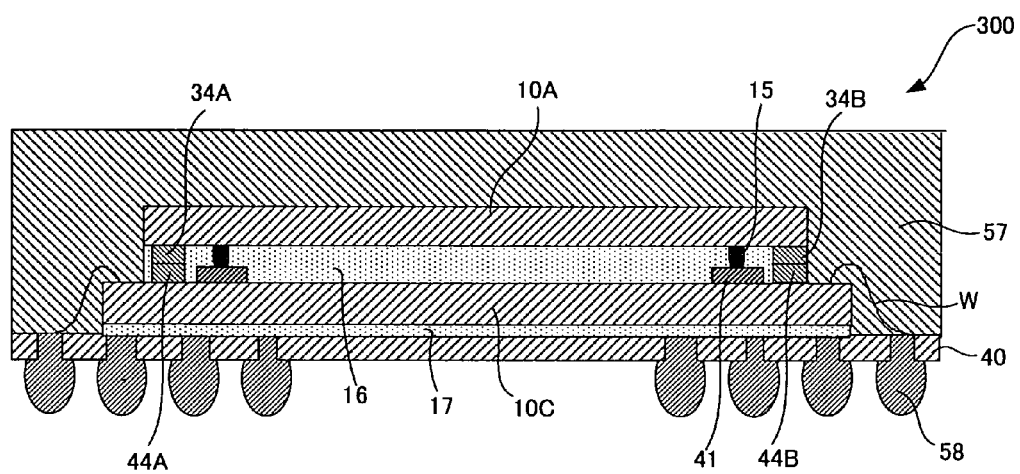
FIG. 3C is a schematic vertical cross-sectional view showing the second modification of a semiconductor device manufactured using the semiconductor device manufacturing method in First Example.

FIG. 3C shows another example of a semiconductor device having a dual-chip semiconductor structure manufactured using the semiconductor device manufacturing method of the present invention.

In the dual-chip semiconductor device 300 shown in this drawing, two semiconductor chips 10C and 10A are stacked on the upper surface of the support substrate 40, with their surfaces each having electric circuits, interconnection patterns, etc., allowed to face each other.

The lower (first) semiconductor chip 10C is fixed to the support substrate 40 by means of a die attach 17, with its surface having interconnection patterns being placed face up.

Meanwhile, the upper (second) semiconductor chip 10A is attracted to the semiconductor chip 10C for alignment due to the magnetic forces between the magnetic bumps 34A and 34B on the surface of the semiconductor chip 10A and the magnetic bumps 44A and 44B on the semiconductor chip 10C. The semiconductor chip 10A is also fixed to the semiconductor chip 10C with underfiller 16, with the electrodes 15 on its surface being connected to the electrodes 41 of the semiconductor chip 10C, i.e., with the semiconductor chip 10A being flip-chip mounted (face down) on the semiconductor chip 10C.

As connection terminals, solder balls 58 are arranged over the other surface (lower surface) of the support substrate 40

One end of each wire W is connected to an electrode of the semiconductor chip 10C, and the other end is connected to a connection terminal via an electrode (not shown) of the support substrate 40. Thus, the support substrate 40, semiconductor chip 10A, and semiconductor chip 10C are electrically connected together, and sealed with sealing resin 57 in this state.

Figure 3D:
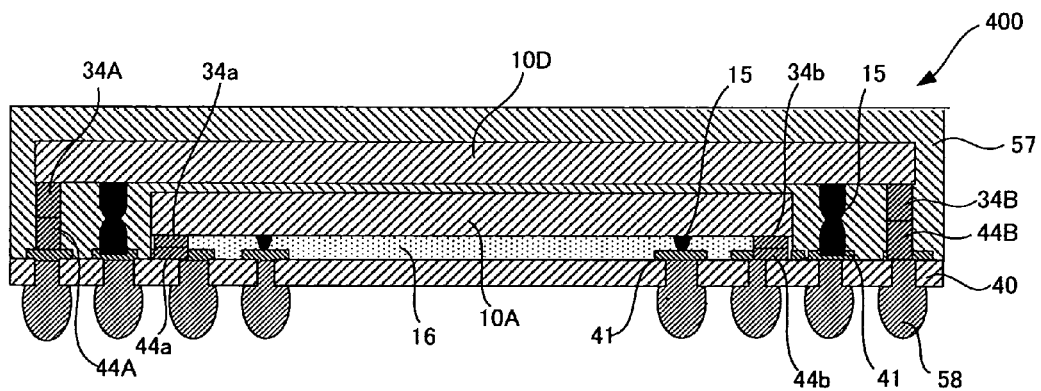
FIG. 3D is a schematic vertical cross-sectional view showing the third modification of a semiconductor device manufactured using the semiconductor device manufacturing method in First Example 1.

FIG. 3D shows still another example of a semiconductor device having a dual-chip semiconductor structure manufactured using the semiconductor device manufacturing method of the present invention.

In the dual-chip semiconductor device 400 shown in this drawing, two unequally-sized semiconductor chips 10A and 10D are stacked on the upper surface of the support substrate 40, with their surfaces each having electric circuits, interconnection patterns, etc., placed face down. Each of the semiconductor chips 10A and 10D is flip-chip mounted (face down) on the upper surface of the support substrate 40.

The lower (first) semiconductor chip 10A is attracted to the support substrate 40 for alignment due to the magnetic forces between the magnetic bumps 34a and 34b on the surface of the semiconductor chip 10A and the magnetic bumps 44a and 44b on the support substrate 40. The semiconductor chip 10A is also fixed to the support substrate 40 with underfiller 16, with the electrodes 15 on its surface being connected to the electrodes 41 of the support substrate 40.

The upper (second) semiconductor chip 10D is larger in size than the lower (first) semiconductor chip 10A, and is attracted to the support substrate 40 for alignment due to the magnetic forces between the magnetic bumps 34A and 34B on the surface of the semiconductor chip 10D and the magnetic bumps 44A and 44B on the support substrate 40. The electrodes 15 on the semiconductor chip 10D are connected to the electrodes 41 of the support substrate 40.

As connection terminals, solder balls 58 are arranged over the other surface (lower surface) of the support substrate 40.

The support substrate 40, semiconductor chip 10A, and semiconductor chip 10D are electrically connected together, and sealed with sealing resin 57 in this state.

Note that the size of the magnetic bumps can be determined depending on the shape of the semiconductor chip and the positions where the magnetic bumps are arranged.

EXAMPLE 2

Second Example of the semiconductor device manufacturing method of the present invention will be described with reference to the drawings.

Herein, a semiconductor chip corresponds to the first base and a rectangular substrate corresponds to the second base.

In addition, the alignment step is carried out by means of the magnetic forces between magnetic bumps on semiconductor chips and magnetic bumps on a tray, and the semiconductor chips are bonded to a rectangular substrate. In this way a semiconductor device (package) can be manufactured as a pair of bases.

In Example 2 the electrode connection step is carried out on a chip rows-by-chip rows basis, each chip row consisting of a plurality of semiconductor chips, rather than on a semiconductor substrate-by-semiconductor substrate basis as in Example 1.

Figure 4A:
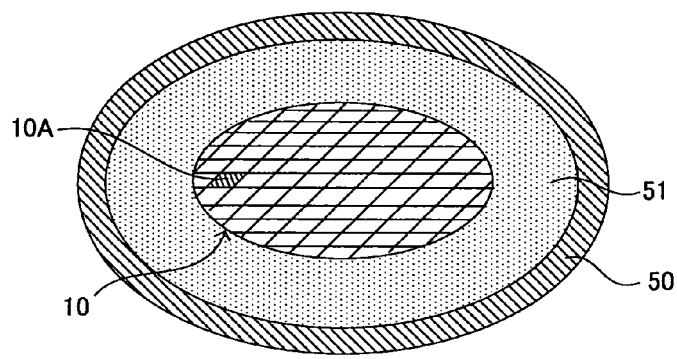
FIG. 4A is a perspective view showing the first step in Second Example of the semiconductor device manufacturing method.

In this Example magnetic bumps are formed over each of a plurality of semiconductor chips 10A formed over a semiconductor substrate 10 shown in FIG. 4A.

Figure 4B:
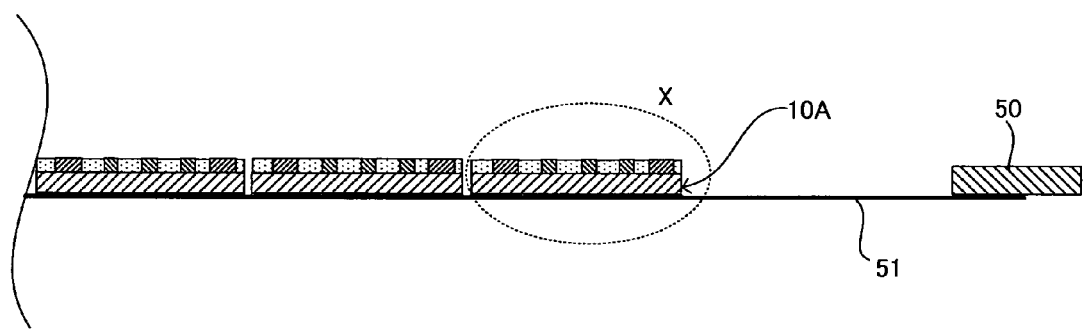
FIG. 4B is a vertical cross-sectional view showing the first step in Second Example of the semiconductor device manufacturing method.
Figure 4C:
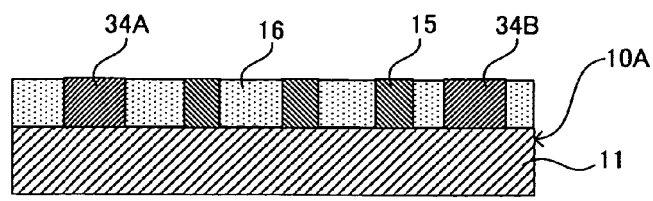
FIG. 4C is an enlarged vertical cross-sectional view showing a separate semiconductor chip in FIG. 4B.
Figure 4D:
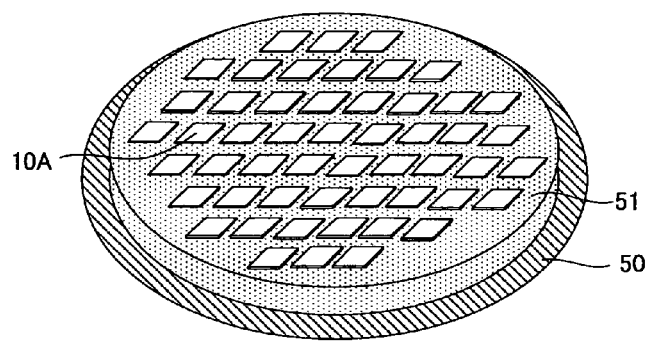
FIG. 4D is a perspective view showing the second step in Second Example of the semiconductor device manufacturing method.
Figure 4E:
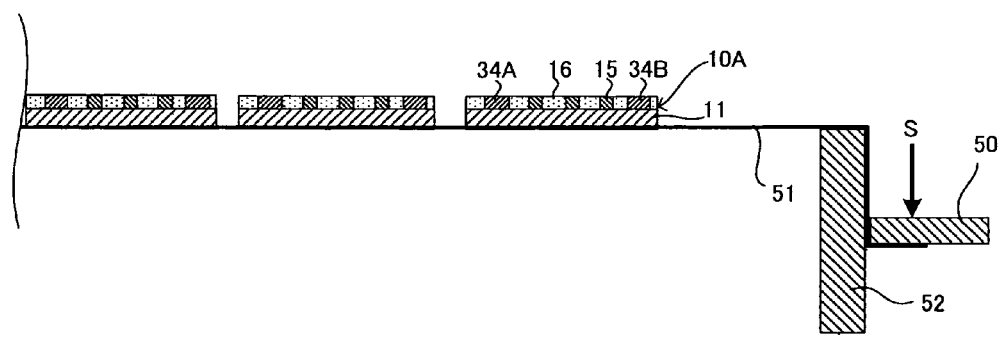
FIG. 4E is a vertical cross-sectional view showing the second step in Second Example of the semiconductor device manufacturing method.
Figure 4F:
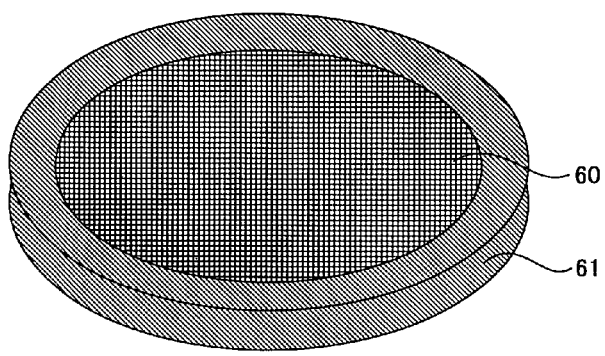
FIG. 4F is a perspective view showing the third step in Second Example of the semiconductor device manufacturing method.

Magnetic bumps that correspond to the magnetic bumps of the semiconductor chips 10A are also formed over a tray 60 (see FIG. 4F).

A method similar to that adopted in Example 1 can be used for the formation of such magnetic bumps.

In this Example the semiconductor substrate 10 having a plurality of semiconductor chips formed over its surface is first attached to a dicing tape 51 supported by a WF ring 50, as shown in FIG. 4A. Using a dicing blade (not shown), the semiconductor substrate 10 is cut into individual semiconductor chips 10A.

Note that FIG. 4B is a vertical cross-sectional view of the diced semiconductor substrate 10 on the dicing tape 51, and FIG. 4C is an enlarged view of a separate semiconductor chip 10A in the X portion encircled by a dotted line of FIG. 4B.

In FIG. 4C electrodes 15, insulating film 16, and magnetic bumps 34A and 34B are arranged over a semiconductor substrate 11 of the semiconductor chip 10A.

After singulation, the dicing tape 51 is expanded to widen the space between adjacent semiconductor chips 10A, as shown in FIGS. 4D and 4E. The dicing tape 51 can be expanded by pushing down the WF ring 50 along the circumferential surface of an expansion ring 52, as indicated by arrow S of FIG. 4E.

Figure 4G:
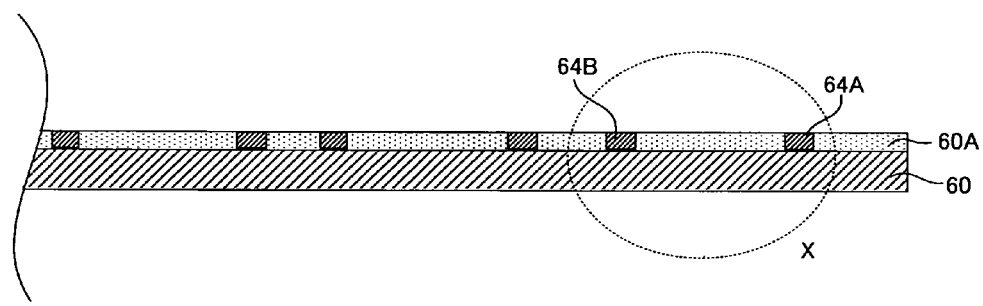
FIG. 4G is a vertical cross-sectional view showing the third step in Second Example of the semiconductor device manufacturing method.
Figure 4H:
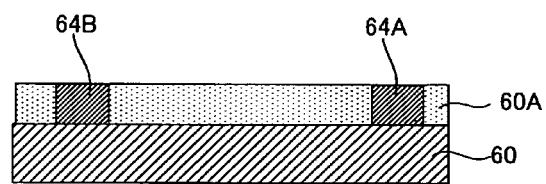
FIG. 4H is an enlarged vertical cross-sectional view showing a separate semiconductor chip in FIG. 4G.

As shown in FIG. 4G, an insulating resin layer 60A is formed over one surface of the tray 60 shown in FIG. 4F (and FIG. 4I), and magnetic patterns 64A and 64B (hereinafter collectively referred to as "magnetic bumps 64" in some cases) are formed at positions corresponding to the magnetic patterns 34A and 34B (magnetic bumps 34) formed over the semiconductor chips 10A. FIG. 4H is an enlarged view of the X portion encircled by a dotted line of FIG. 4G.

Materials for the magnetic patterns 64A and 64B can be appropriately determined depending on the intended purpose; materials similar to those used for the magnetic patterns 44A and 44B formed over the substrate 40 in Example 1 can be used.

This is the bump formation step in the semiconductor device manufacturing method of the present invention.

Figure 4I:
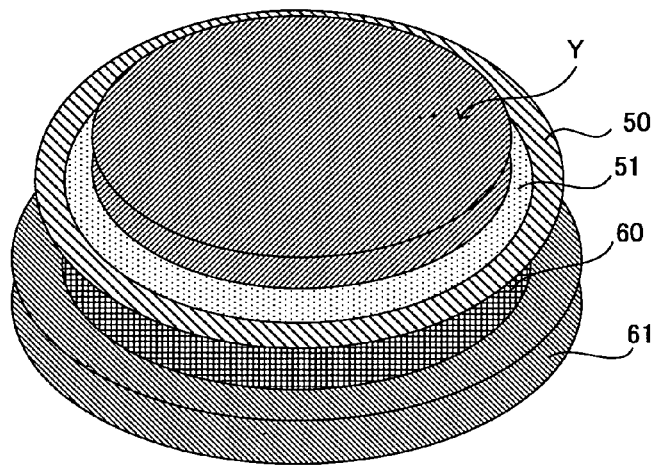
FIG. 4I is a perspective view showing the fourth step in Second Example of the semiconductor device manufacturing method.

Subsequently, as shown in FIG. 4I, the tray 60 is placed on a tray holder 61, and the semiconductor substrate 10 is placed on the tray 60 on its upper surface.

A chip separator Y is placed on the semiconductor substrate 10.

Figure 4J:
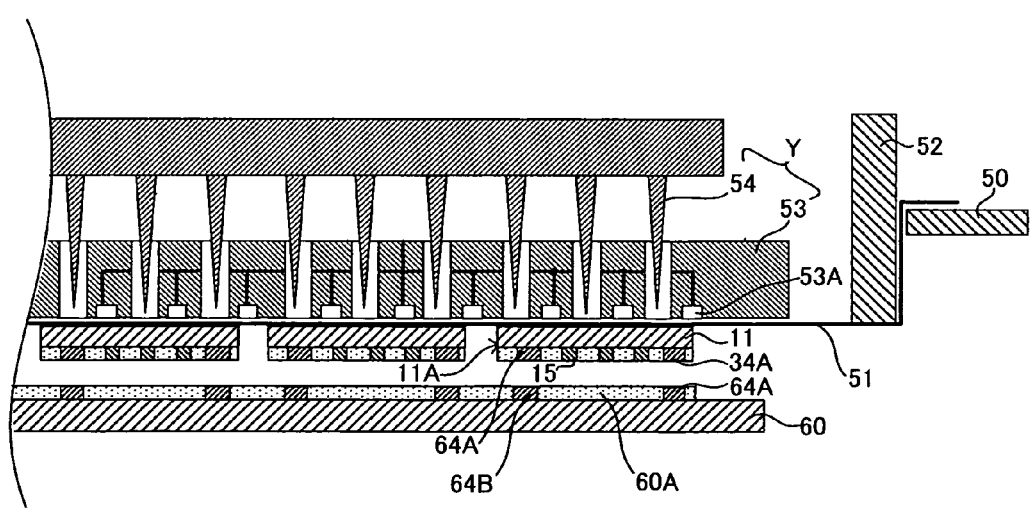
FIG. 4J is a vertical cross-sectional view showing the fourth step in Second Example of the semiconductor device manufacturing method.

As shown in FIG. 4J, the chip separator Y has a WF table 53 and push-up pins 54.

Figure 4K:
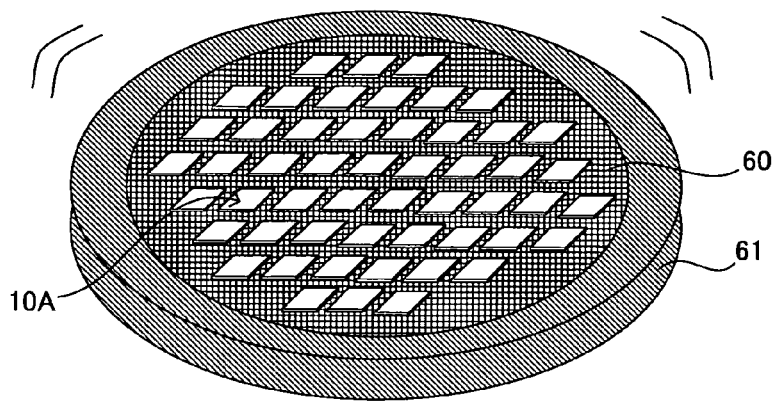
FIG. 4K is a perspective view showing the fifth step in Second Example of the semiconductor device manufacturing method.
Figure 4L:
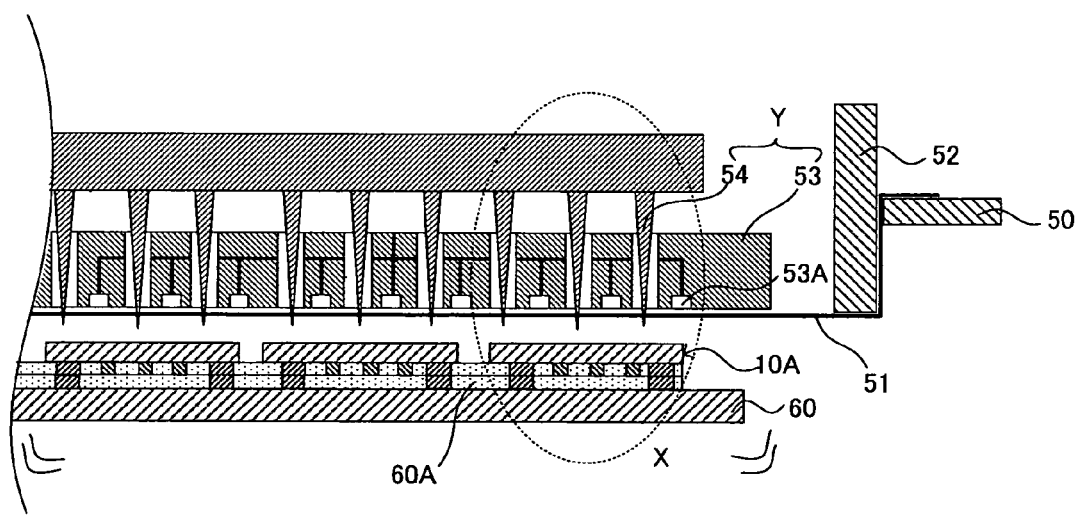
FIG. 4L is a vertical cross-sectional view showing the fifth step in Second Example of the semiconductor device manufacturing method.

The push-up pins 54 of the chip separator Y are then pushed down as shown in FIG. 4L to separate the semiconductor chips 10A from the dicing tape 51. As shown in FIG. 4K, the separate semiconductor chips 10A are then held against the surface of the tray 60.

Figure 4M:
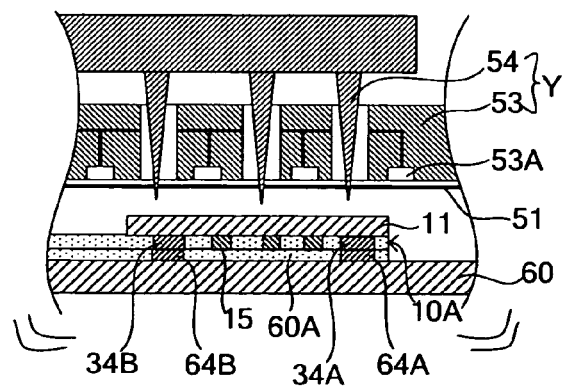
FIG. 4M is an enlarged vertical cross-sectional view showing a separate semiconductor chip in FIG. 4L.
Figure 4N:
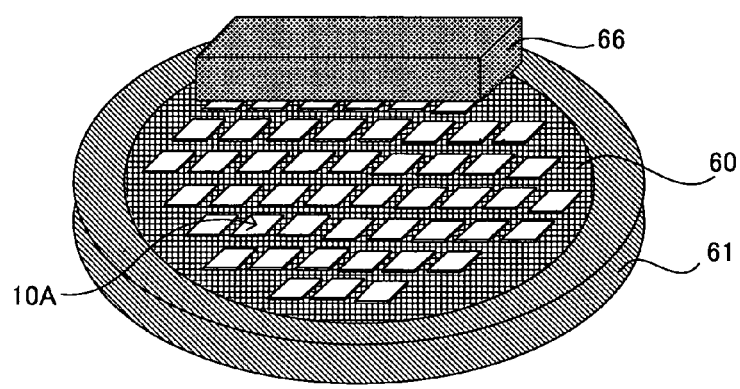
FIG. 4N is a perspective view showing the sixth step in Second Example of the semiconductor device manufacturing method.

FIG. 4M shows an enlarged view of a separate semiconductor chip 10A in the X portion encircled by a dotted line of FIG. 4L.

As shown in FIG. 4M, the magnetic patterns 64A and 64B (magnetic bumps 64) formed over the tray 60 are arranged immediately under the semiconductor chip 10A, and the magnetic forces between the magnetic bumps 34 and the magnetic bumps 64 causes the magnetic bumps 34 on the semiconductor chip 10A and the magnetic bumps 64 on the tray 60 to attract each other. As a result, the semiconductor chip 10A is automatically brought in proper alignment with the tray 60. At this point, vibrating the tray 60 can facilitate alignment.

In this way the semiconductor chips 10A on the dicing tape 51 are transferred onto the tray 60, and held thereto (see FIG. 4M).

This is the alignment step in the semiconductor device manufacturing method of the present invention.

Next, a rectangular substrate 65 is prepared as a support substrate, and the semiconductor chips 10A held on the tray 60 are mounted on the rectangular substrate 65.

More specifically, a set of rows of the plurality of semiconductor chips 10A is selected from the population of the semiconductor chips 10A magnetically aligned on the tray 60, and is simultaneously held against a connection tool 66.

Here, the connection tool 66 has a plurality of individual holding heads which are designed such that head intervals can be changed. For this reason, when the plurality of semiconductor chips 10A on the tray 60 is to be held against the connection tool 60, the head intervals can be changed according to the intervals between individual semiconductor chips 10A.

The plurality of semiconductor chips 10A on the tray 60 is held against such a tool as the connection tool 66 by vacuum aspiration.

As described above, the semiconductor chips 10A are held on the tray 60 by means of the magnetic forces between the magnetic bumps 34 on the semiconductor chips 10A and the magnetic bumps 64 on the tray 60. However, the semiconductor chips 10A can be readily picked up by the connection tool 66 by causing it to exert a holding force stronger than the magnetic forces.

Figure 4O:
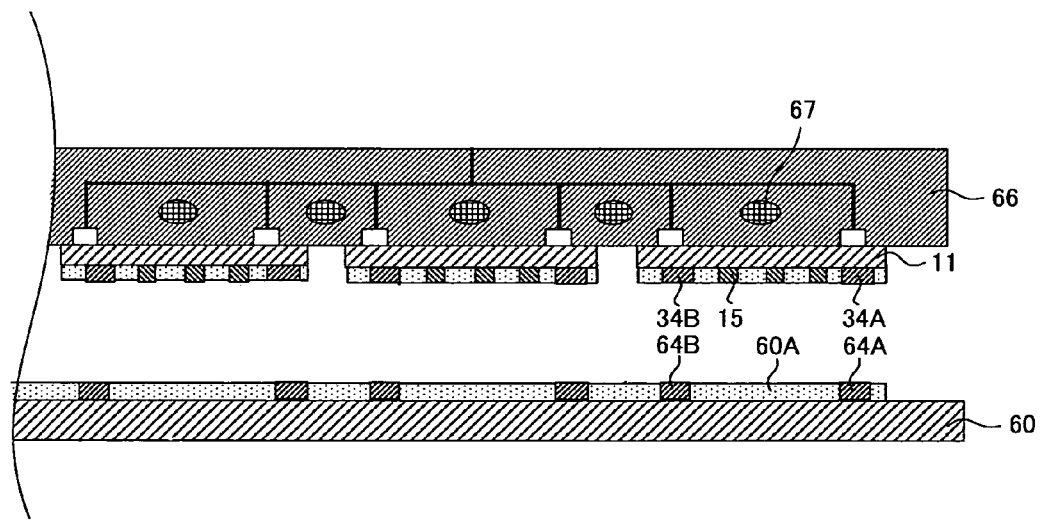
FIG. 4O is a vertical cross-sectional view showing the sixth step in Second Example of the semiconductor device manufacturing method.

As shown in FIG. 4O, heaters 67 are embedded in the connection tool 66, by which the semiconductor chips 10A can be heated as needed.

Figure 4P:
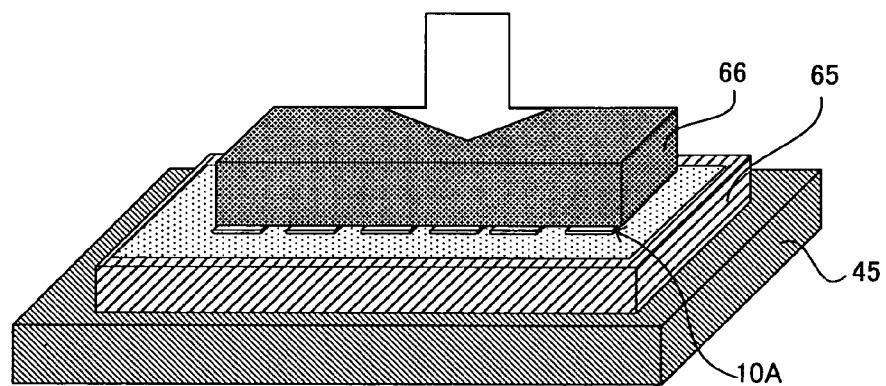
FIG. 4P is a perspective view showing the seventh step in Second Example of the semiconductor device manufacturing method.

As shown in FIG. 4P, the connection tool 66 holding the semiconductor chips 10A is then transferred onto the rectangular substrate 65 placed on the substrate holder 45.

As described above, the semiconductor chips 10A and the tray 60 have already been in proper alignment, and since the transfer precision of the connection tool 66 is ensured, there is no need to perform a special operation (e.g., position recognition) for proper alignment of the semiconductor chips 10A with the rectangular substrate 65.

Figure 4Q:
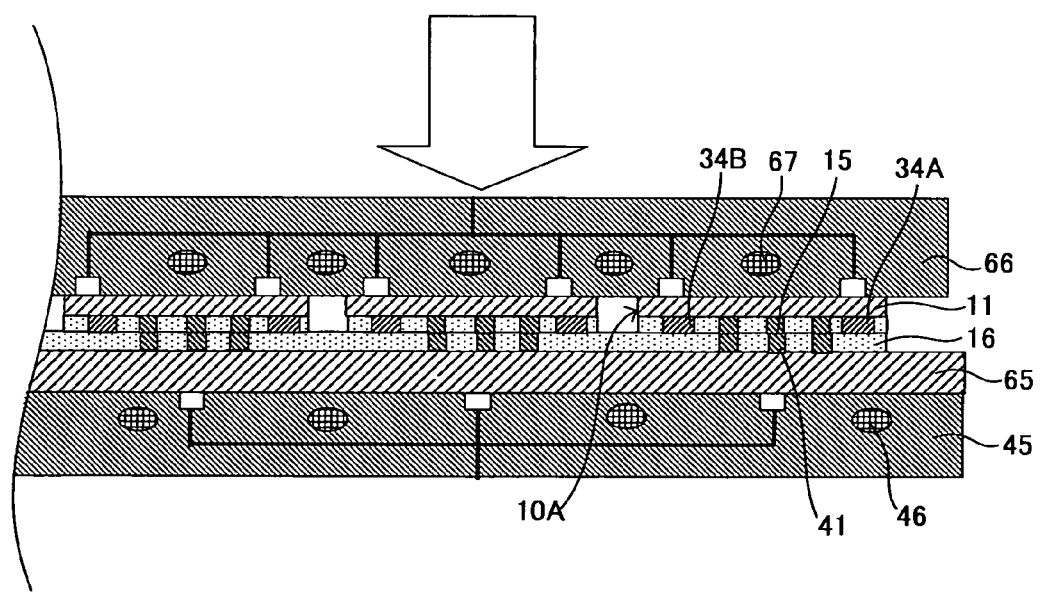
FIG. 4Q is a vertical cross-sectional view showing the seventh step in Second Example of the semiconductor device manufacturing method.

After transfer, the connection tool 66 is pressed against the semiconductor chips 10A for a given period of time as shown in FIGS. 4P and 4Q, and the heaters 67 embedded in the connection tool 66 are turned on for heating.

As a consequence, the semiconductor chips 10A and the rectangular substrate 65, which have been brought in proper alignment, are bonded together at their electrodes (i.e., electrodes 15 and electrodes 41). The entire process is carried out on a chip rows-by-chip rows basis, each chip row consisting of the plurality of semiconductor chips 10A.

This is the electrode connection step in the semiconductor device manufacturing method of the present invention.

Figure 4R:
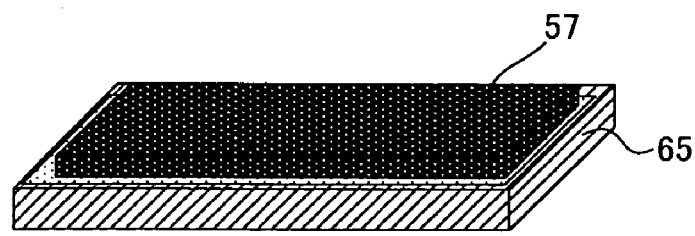
FIG. 4R is a perspective view showing the eighth step in Second Example of the semiconductor device manufacturing method.

After sealing the semiconductor chips with sealing resin 57 as shown in FIG. 4R, solder balls 58 are arranged over the backside of the rectangular substrate 65 (see FIG. 3A).

Figure 4S:
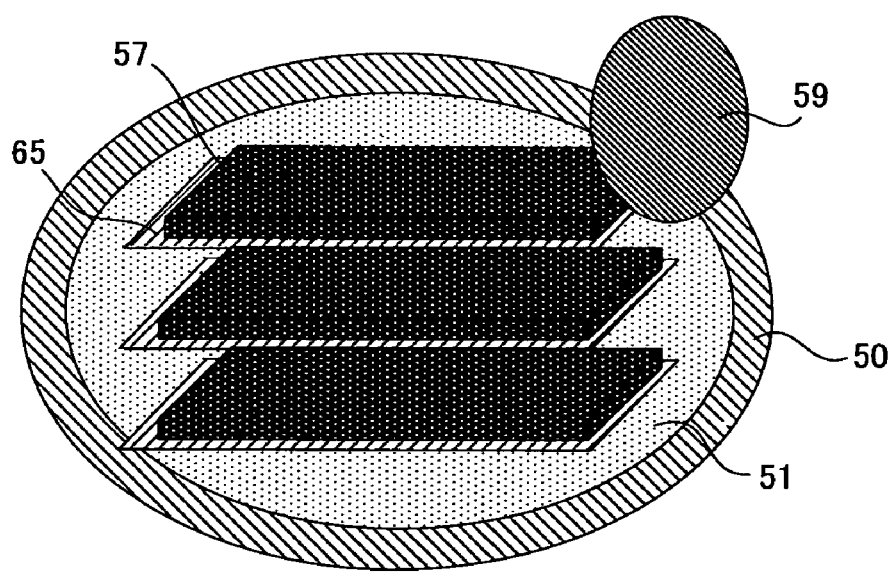
FIG. 4S is a perspective view showing the ninth step in Second Example of the semiconductor device manufacturing method.

As shown in FIG. 4S, the rectangular substrate 65 is then attached to a dicing tape 51 attached to a WF ring 50.

Through package dicing using a blade 59, the rectangular substrate 65 sealed with the sealing resin 57 is cut into individual semiconductor devices, producing the semiconductor device 100 shown in FIG. 3A.

As described above, in Example 2, a rectangular support substrate is employed and the connection of the electrodes of the semiconductor chips to those of the rectangular support substrate is carried out on a chip rows-by-chip rows basis, each chip row consisting of a plurality of the semiconductor chips. Thus, as in Example 1, it is possible to significantly reduce the manufacturing time and to achieve reduction in the manufacturing costs.

In contrast to Example 1 where a circular substrate is used as a support substrate, a rectangular substrate is used in Example 2. With the semiconductor device manufacturing method of the present invention, electrodes of semiconductor chips can be efficiently connected to those of a support substrate according to the shape of the support substrate.

EXAMPLE 3

Third Example of the semiconductor device manufacturing method of the present invention will be described with reference to the drawings.

In this Example a semiconductor chip corresponds to the first base and a band-shaped substrate corresponds to the second base.

In addition, the alignment step is carried out by means of the magnetic forces between the magnetic bumps on semiconductor chips and the magnetic bumps on a band-shaped substrate, and through the electrode connection step the electrodes on the semiconductor chips and the electrodes on the band-shaped substrate are connected together. In this state, the semiconductor chips are wound on a reel together with the band-shaped substrate for storage.

In Example 3 the electrode connection step is carried out on a chip row-by-chip row basis, each chip row consisting of a plurality of semiconductor chips.

Figure 5A:
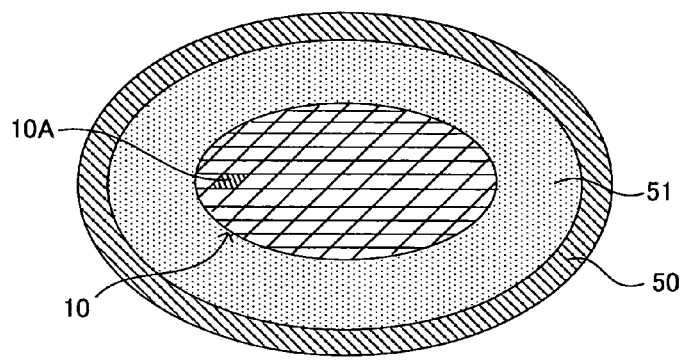
FIG. 5A is a perspective view showing the first step in Third Example of the semiconductor device manufacturing method.
Figure 5B:
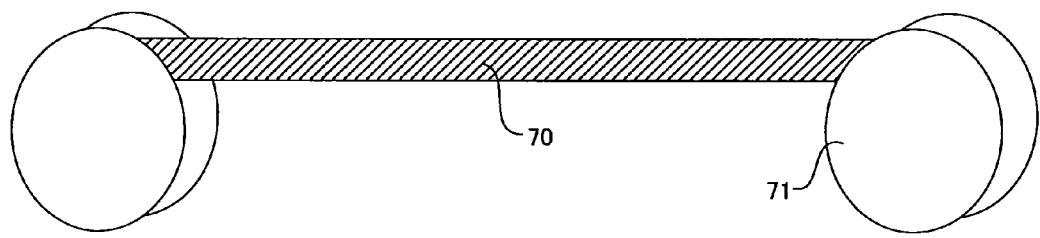
FIG. 5B is a perspective view showing the second step in Third Example of the semiconductor device manufacturing method.

Magnetic bumps are first formed over each semiconductor chip 10A formed over a semiconductor substrate 10 shown in FIG. 5A, as in Example 1. Similarly, magnetic bumps that correspond to the magnetic bumps of the semiconductor chips 10A are also formed over a band-shaped substrate 70 shown in FIG. 5B. Note that the functions and several other features of the band-shaped substrate 70 are identical to those of the foregoing substrates except that it has a band shape.

A method similar to that adopted in Example 1 and shown in FIGS. 1A to 1J can be used for the formation of these magnetic bumps.

Magnetic patterns 74A and 74B (hereinafter collectively referred to as "magnetic bumps 74" in some cases) are formed over one surface of the band-shaped substrate 70 in such a way that they form a mirror image of the magnetic patterns 34A and 34B (magnetic bumps 34) formed over the semiconductor chips 10A (see FIG. 5F).

This is the bump formation step in the semiconductor device manufacturing method of the present invention.

As shown in FIG. 5A, the semiconductor substrate 10 is then attached to a dicing tape 51 attached to a WF ring 50.

Using a blade (not shown), the semiconductor substrate 10 is cut into individual semiconductor chips 10A.

Figure 5C:
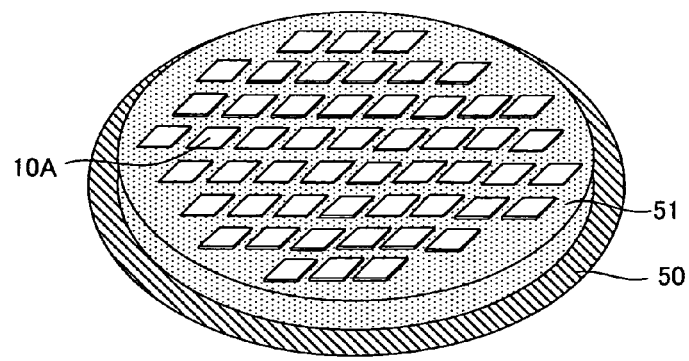
FIG. 5C is a perspective view showing the third step in Third Example of the semiconductor device manufacturing method.

After singulation, the dicing tape 51 is expanded to widen the space between adjacent semiconductor chips 10A as shown in FIG. 5C.

Figure 5D:
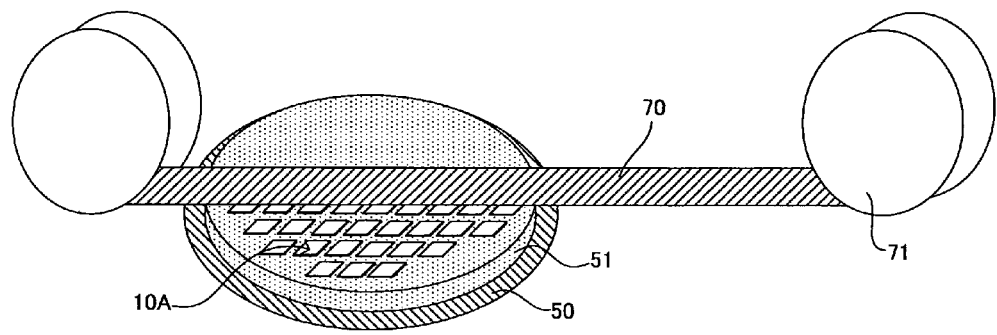
FIG. 5D is a perspective view showing the fourth step in Third Example of the semiconductor device manufacturing method.

Subsequently, as shown in FIG. 5D, the band-shaped substrate 70 previously prepared is placed on the semiconductor chips 10A. Note, at this point, that this step only requires rough alignment rather than precise alignment.

Figure 5E:
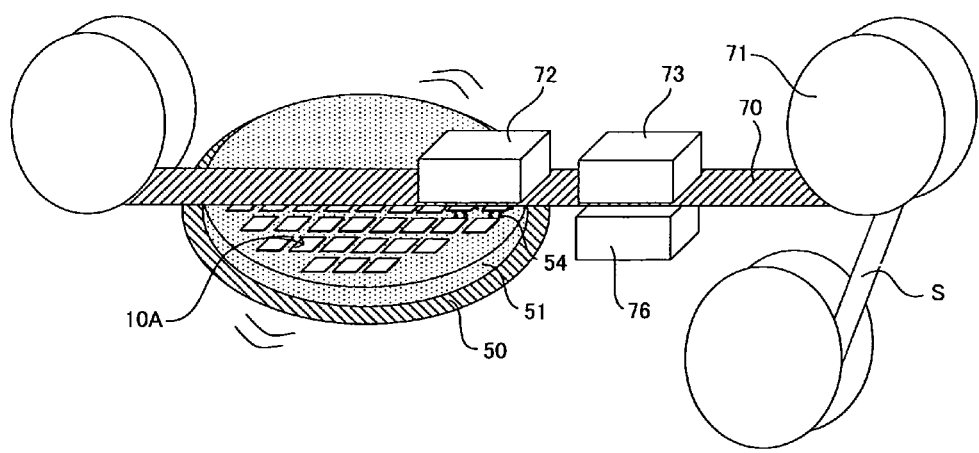
FIG. 5E is a perspective view showing the fifth step in Third Example of the semiconductor device manufacturing method.
Figure 5F:
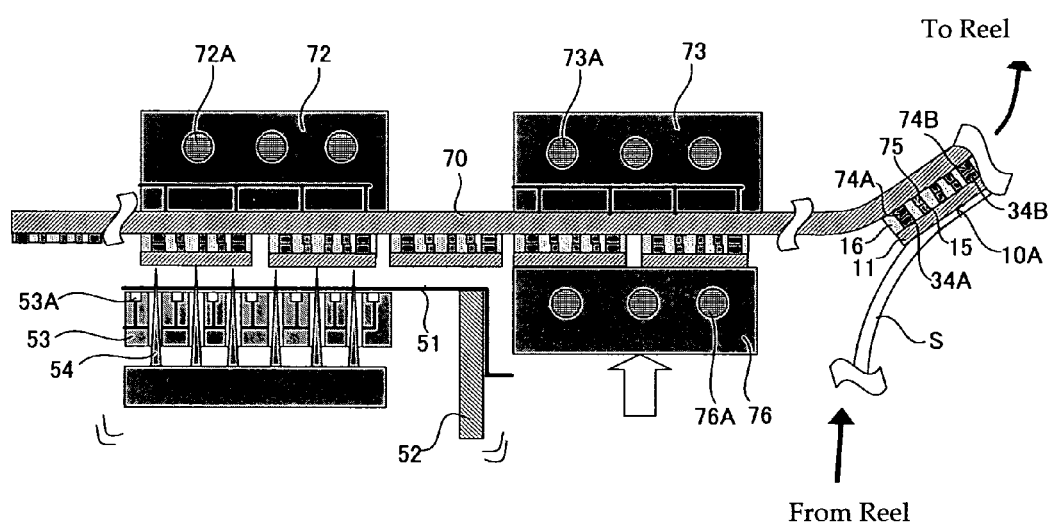
FIG. 5F is a vertical cross-sectional view showing the fifth step in Third Example of the semiconductor device manufacturing method.

As shown in FIGS. 5E and 5F, the band-shaped substrate 70 is wound on a real 71, with its electrodes 75 connected to the electrodes 15 on the semiconductor chips 10A.

As shown in FIG. 5F, push-up pins 54 are arranged in units covering about 2-5 chips under the semiconductor chips 10A. The push-up pins 54 are so designed that they can move upward, and in order for this to happen, holes for the push-up pins 54 are formed in the WF table 53. Moreover, the WF table 53 is provided with vacuum aspiration holes 53A through which the dicing tape 51 is held against the WF table 53 by vacuum aspiration using a vacuum source (not shown).

By pushing up the push-up pins 54 in this state, the semiconductor chips 10A are separated from the dicing tape 51.

The band-shaped substrate 70 is arranged above the semiconductor chips 10A. The electrodes 75 are formed over the band-shaped substrate 70. The magnetic bumps 34 on the semiconductor chips 10A and the magnetic bumps 74 on the band-shaped substrate 70 are attracted each other due to the magnetic forces between the magnetic bumps 34 and the magnetic bumps 74. As a result, the semiconductor chips 10A are automatically brought in proper alignment with the band-shaped substrate 70. At this point, vibrating the semiconductor chips 10A can facilitate alignment.

These operations are carried out per 2-5 chips. The positions of the push-up pins 54 are fixed, and the semiconductor chips 10A to be separated are moved so that they are above the push-up pins 54 for separation.

This is the alignment step in the semiconductor device manufacturing method of the present invention.

A heater block 72 is arranged above the push-up pins 54. The heater block 72 is provided with heaters 72A for heating and vacuum holes for holding the band-shaped substrate 70. The aligned semiconductor chips 10A are heated to a temperature sufficient for underfiller (insulating film) 16 to become sticky, whereby the semiconductor chips 10A are temporarily bonded to the band-shaped substrate 70 so as not to be movable.

A heater block 73 is arranged downstream from the heater block 72 (right side in FIGS. 5E and 5F). The heater block 73 has heaters 73A for heating and vacuum holes for holding the band-shaped substrate 70, just as the heater block 72 has. A pressurizing tool 76 is provided across the band-shaped substrate 70 from the heater block 73. Similarly, the pressurizing tool 76 also has heaters 76A.

When the semiconductor chips 10A that have been temporarily bonded to the band-shaped substrate 70 passes by the heater block 73, the semiconductor chips 10A are heated and pressurized by means of the pressurizing tool 76 from beneath. As a consequence, the semiconductor chips 10A and the band-shaped substrate 70, which have been brought in proper alignment, are bonded together at their electrodes (i.e., the electrodes 15 and electrodes 75).

The band-shaped substrate 70 having the semiconductor chips 10A bonded is then wound on the reel 71. At this point, an interposing sheet S is interposed to avoid direct contact of the backsides of the semiconductor chips 10A with the reel 71.

This is the electrode connection step in the semiconductor device manufacturing method of the present invention.

In Example 3 the electrode connection step is carried out on a chip low-by-chip low basis, each chip low consisting of a plurality of semiconductor chips. Thus, with the semiconductor device manufacturing method of Example 3, it is possible to eliminate several operations that have conventionally been required—visual alignment of semiconductor chips with the support substrate, chip pick up involving the use of tools, and inversion transferring of the semiconductor chips, and to reduce the manufacturing time, though it is less efficient than the manufacturing method of Example 1 that processes on a semiconductor substrate-by-semiconductor substrate basis.

In addition, since a band-shaped support substrate is used in Example 3, the semiconductor device manufacturing method of Example 3 is suitable for the manufacturing of a semiconductor device using such a thin substrate as a FPC (Flexible Print Circuit) board.

Figure 6A:
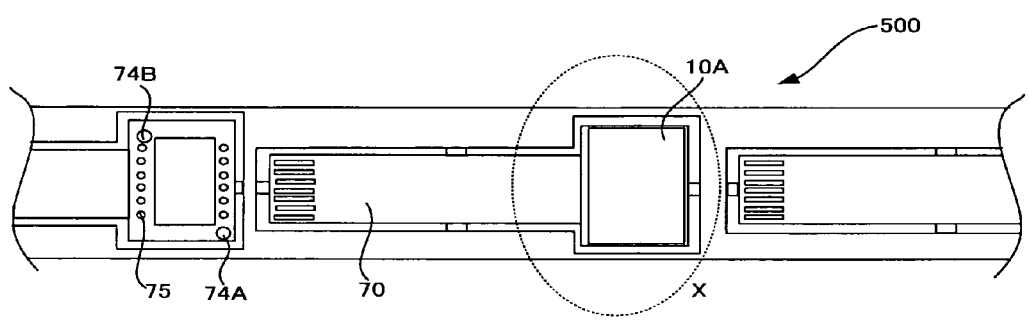
FIG. 6A is a top view showing an example of application of a semiconductor device manufactured using the semiconductor device manufacturing method in Third Example.
Figure 6B:
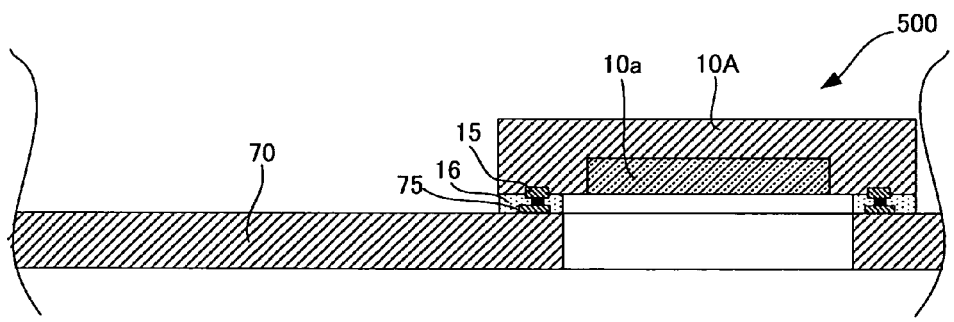
FIG. 6B is an enlarged vertical cross-sectional view showing a sensor chip in the X portion encircled by a dotted line of FIG. 6A.
Figure 7A:
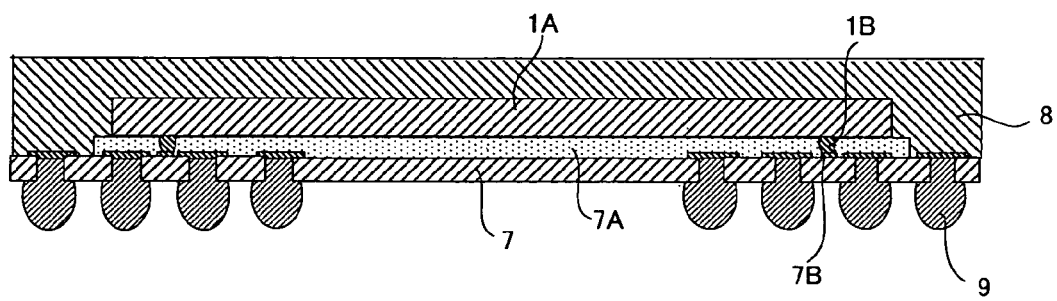
FIG. 7A is a schematic vertical cross-sectional view showing a semiconductor device manufactured using a conventional semiconductor device manufacturing method.
Figure 7B:
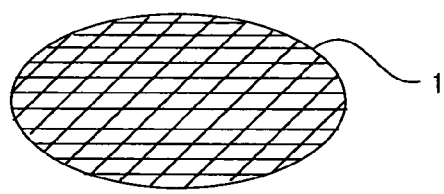
FIG. 7B is a perspective view showing the first step in an example of the conventional semiconductor device manufacturing method.
Figure 7C:
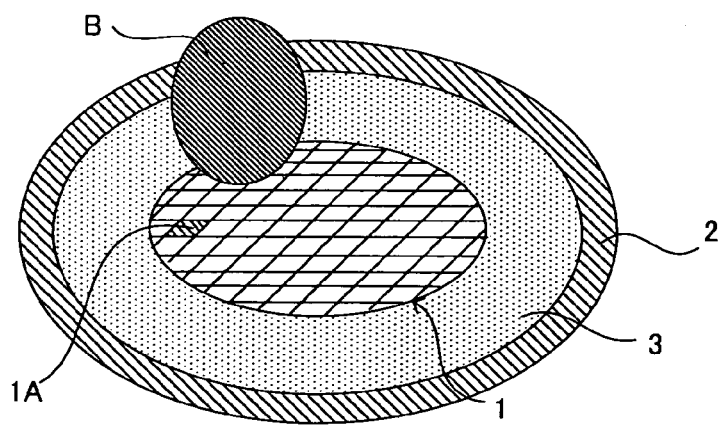
FIG. 7C is a perspective view showing the second step in the example of the conventional semiconductor device manufacturing method.
Figure 7D:
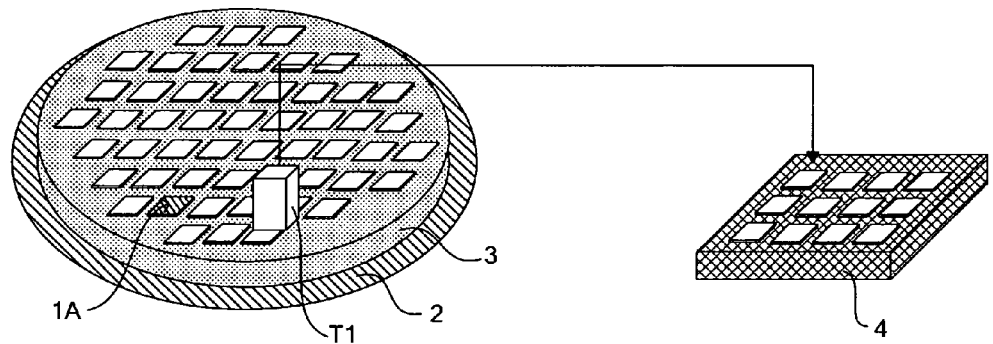
FIG. 7D is a perspective view showing the third step in the example of the conventional semiconductor device manufacturing method.
Figure 7E:
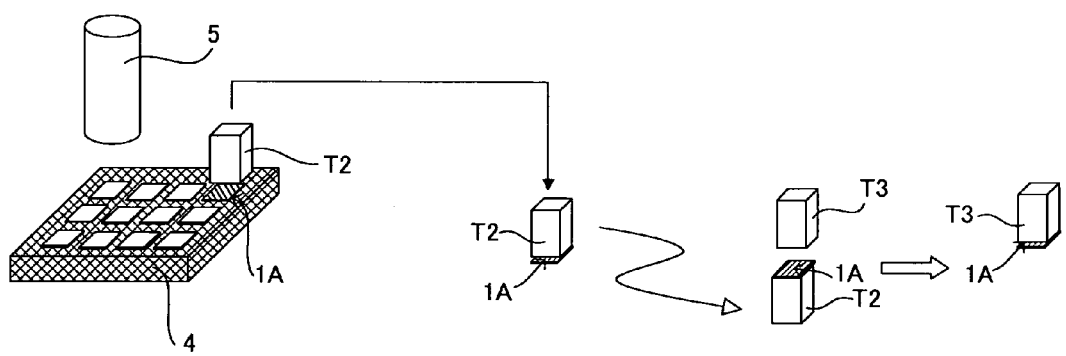
FIG. 7E is a perspective view showing the fourth step in the example of the conventional semiconductor device manufacturing method.
Figure 7F:
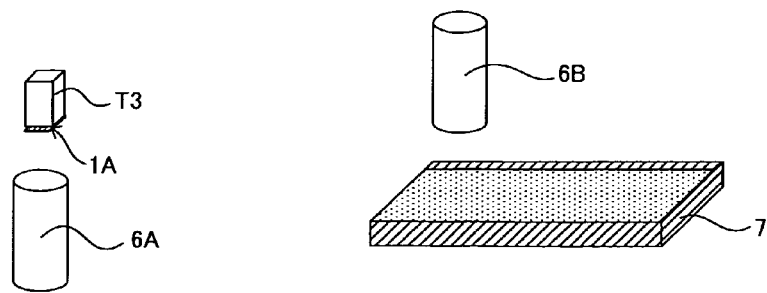
FIG. 7F is a perspective view showing the fifth step in the example of the conventional semiconductor device manufacturing method.
Figure 7G:
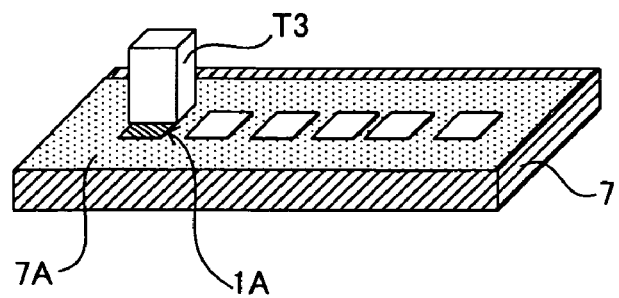
FIG. 7G is a perspective view showing the sixth step in the example of the conventional semiconductor device manufacturing method.
Figure 7H:
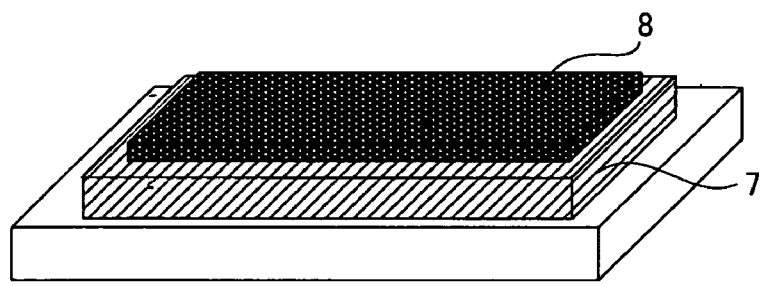
FIG. 7H is a perspective view showing the seventh step in the example of the conventional semiconductor device manufacturing method.
Figure 7I:
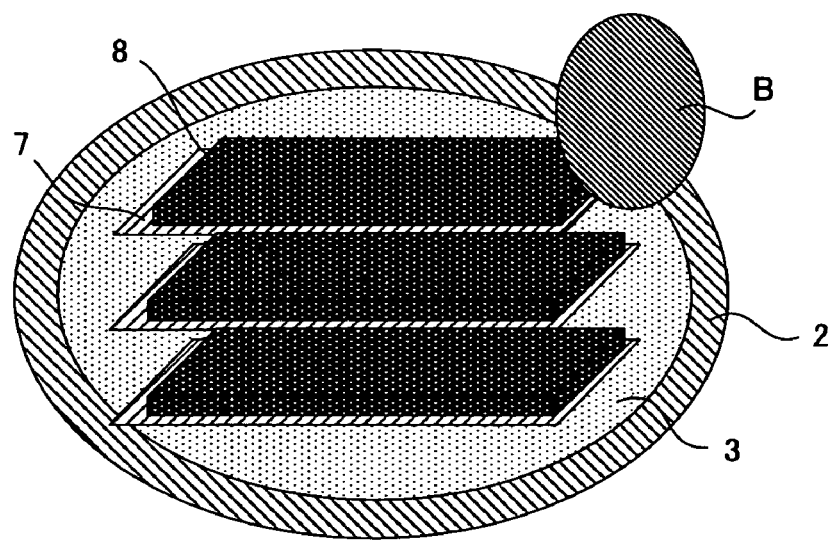
FIG. 7I is a perspective view showing the eighth step in the example of the conventional semiconductor device manufacturing method.

As an application of such a FPC board, an example of an image sensor module is shown in FIGS. 6A and 6B. FIG. 6A is a top view of the image sensor module, and FIG. 6B is an enlarged vertical cross-sectional view of the sensor chip in the X portion encircled by a dotted line of FIG. 6A. By bonding a FPC board (or the band-shaped substrate 70) to an image sensor chip (the semiconductor chip 10A) having a light-receiving part 10a at their electrodes (i.e., the electrodes 75 and electrodes 15) using the semiconductor device manufacturing method of Example 3 and by mounting passive components thereon as needed, a sensor module 500 shown in FIGS. 6A and 6B is manufactured as the semiconductor device.

The sensor module 500 is mounted on a mounting board of final products such as cellular phones.

It is, of course, possible to produce the foregoing BGA semiconductor devices by dividing the band-shaped substrate into rectangular pieces, sealing them with sealing resin, arranging solder balls on their backsides, and cutting them into individual semiconductor chips.

According to the semiconductor device manufacturing method of the present invention, there is no need to recognize the positions of electrodes on semiconductor chips and the positions of electrodes on a substrate when connecting them together, and the semiconductor chips can be automatically brought in proper alignment with the substrate. In particular, according to the semiconductor device manufacturing method of Example 1, it is possible to significantly reduce the manufacturing time because each step can be carried out at a wafer level.

For example, at present, flip-chip bonding requires 30-60 seconds for one chip, but with the semiconductor device manufacturing method of the present invention it is possible to pick up as many as 700 chips (provided chip size=6 mm$^2$) at a time and transfer them to their respective corresponding electrodes, requiring only 20 seconds per cycle for processing and realizing throughput as high as 0.028 sec/chip.

According to the present invention, it is possible to solve the foregoing conventional problems and to connect electrodes of a pair of bases (e.g., a pair of a semiconductor chip and a circuit board, or a pair of semiconductor chips) together in a short time, thereby providing a low-cost, efficient semiconductor device manufacturing method.

With the semiconductor device manufacturing method of the present invention, it is possible to connect electrodes of a pair of bases (e.g., a pair of a semiconductor chip and a circuit board, or a pair of semiconductor chips) together in a short time and to manufacture semiconductor devices inexpensively and efficiently.

What is claimed is:

1. A semiconductor device manufacturing method, comprising:
   forming magnetic bumps over a resin layer of at least one of first and second bases which are to be bonded together at their corresponding electrodes;
   aligning the electrodes of the first base to positions corresponding to the electrodes of the second base for connection, by means of magnetic forces of the magnetic bumps formed on the first base; and
   connecting the electrodes of the first base to the electrodes of the second base,
   wherein the alignment is made for a plurality of the first bases at a time.

2. The semiconductor device manufacturing method according to claim 1, wherein the magnetic forces of the magnetic bumps formed over the first base are exerted by magnetic bumps having magnetization.

3. The semiconductor device manufacturing method according to claim 1, wherein the first base is a semiconductor chip and the second base is one of a semiconductor chip and a circuit board.

4. The semiconductor device manufacturing method according to claim 1, wherein the alignment is made by means of magnetic forces between the magnetic bumps formed over the first base and the magnetic bumps formed over the second base.

5. The semiconductor device manufacturing method according to claim 1, wherein the alignment is made by means of magnetic forces between the magnetic bumps formed over the first base and magnetic bumps formed over a tray.

6. The semiconductor device manufacturing method according to claim 5, wherein a plurality of the first bases is arranged over the tray.

7. The semiconductor device manufacturing method according to claim 6, wherein a plurality of base rows is arranged over the tray, each base row consisting of a plurality of the first bases.

8. The semiconductor device manufacturing method according to claim 7, wherein the electrode connection is performed on a plurality of base rows at a time, each base row consisting of a plurality of the first bases.

9. The semiconductor device manufacturing method according to claim 8, wherein the second base is a rectangular substrate.

10. The semiconductor device manufacturing method according to claim 1, wherein the electrode connection is performed for each base row consisting of a plurality of the first bases.

11. The semiconductor device manufacturing method according to claim 10, wherein the second base is a band-shaped substrate.

12. The semiconductor device manufacturing method according to claim 11, wherein the first base is wound on a reel together with the second base, with their corresponding electrodes connected together upon the electrode connection.

* * * * *